US012785706B2

(12) United States Patent
Hirai et al.

(10) Patent No.: US 12,785,706 B2
(45) Date of Patent: Nov. 3, 2026

(54) METAL-GAS-FILLED CELL AND METHOD FOR MANUFACTURING THE SAME

(71) Applicant: KYOTO UNIVERSITY, Kyoto (JP)

(72) Inventors: Yoshikazu Hirai, Kyoto (JP); Shun Kiyose, Kyoto (JP)

(73) Assignee: KYOTO UNIVERSITY, Kyoto (JP)

( * ) Notice: Subject to any disclaimer, the term of this patent is extended or adjusted under 35 U.S.C. 154(b) by 527 days.

(21) Appl. No.: 18/251,483

(22) PCT Filed: Oct. 27, 2021

(86) PCT No.: PCT/JP2021/039690
§ 371 (c)(1),
(2) Date: May 2, 2023

(87) PCT Pub. No.: WO2022/097557
PCT Pub. Date: May 12, 2022

(65) Prior Publication Data
US 2023/0412178 A1 Dec. 21, 2023

(30) Foreign Application Priority Data
Nov. 6, 2020 (JP) ................................ 2020-185571

(51) Int. Cl.
*H03L 7/26* (2006.01)
*C23C 16/455* (2006.01)
*G04F 5/14* (2006.01)

(52) U.S. Cl.
CPC .......... *H03L 7/26* (2013.01); *C23C 16/45525* (2013.01); *G04F 5/145* (2013.01)

(58) Field of Classification Search
CPC ..... H03L 7/26; C23C 16/45525; G04F 5/145; G04F 5/14; G01N 21/03; G01R 33/26
See application file for complete search history.

(56) References Cited

U.S. PATENT DOCUMENTS 8,218,590 B2 * 7/2012 Youngner ................ G04F 5/14 372/34
8,299,860 B2 * 10/2012 Youngner ................ G04F 5/14 438/456
(Continued)

FOREIGN PATENT DOCUMENTS

JP 2013038382 A 2/2013
JP 2014110464 A * 6/2014
(Continued)

OTHER PUBLICATIONS

JP-2015046535-A, Machine Translation (Year: 2025).*
(Continued)

*Primary Examiner* — Binh X Tran
*Assistant Examiner* — Christopher Remavege
(74) *Attorney, Agent, or Firm* — HSML P.C.

(57) ABSTRACT

A manufacturing method of the present invention includes: attaching a first glass sheet (11) to a first surface (10*p*) of a cell main body (10) to cover a gas generating portion (20) and an injection port (16); injecting a raw material solution (34*a*) of a metal gas into the injection port (16) to introduce the raw material solution (34*a*) into the gas generating portion (20) with the first glass sheet (11) being positioned below the gas generating portion (20) in a vertical direction; and evaporating a solvent contained in the raw material solution (34*a*) to deposit a solid raw material (34*b*) of the metal gas in the gas generating portion (20).

20 Claims, 22 Drawing Sheets

(56) References Cited

U.S. PATENT DOCUMENTS

| | | | | |
|---|---|---|---|---|
| 8,941,442 | B2 * | 1/2015 | Youngner | G04F 5/14 438/455 |
| 9,151,808 | B2 * | 10/2015 | Nagasaka | G01R 33/26 |
| 9,169,974 | B2 * | 10/2015 | Parsa | H03L 7/26 |
| 10,033,394 | B2 * | 7/2018 | Ishihara | H03L 7/26 |
| 10,396,809 | B2 * | 8/2019 | Hayashi | H03L 7/26 |
| 10,707,884 | B2 * | 7/2020 | Matsuda | G04F 5/145 |
| 2012/0206135 | A1 * | 8/2012 | Nagasaka | G01R 33/26 29/527.2 |
| 2012/0243088 | A1 * | 9/2012 | Nagasaka | H01M 6/005 29/527.1 |
| 2013/0015920 | A1 | 1/2013 | Sato et al. | |
| 2015/0027908 | A1 | 1/2015 | Parsa et al. | |
| 2015/0028866 | A1 * | 1/2015 | Parsa | G04F 5/14 324/252 |
| 2015/0061785 | A1 * | 3/2015 | Ishihara | H01S 1/06 331/94.1 |
| 2015/0270843 | A1 * | 9/2015 | Nakajima | H03L 7/26 331/94.1 |
| 2016/0097824 | A1 * | 4/2016 | Fujii | G01R 33/0052 324/244.1 |
| 2016/0109538 | A1 * | 4/2016 | Fujii | G01R 33/26 29/592 |
| 2016/0126965 | A1 * | 5/2016 | Hashi | G04F 5/145 156/60 |
| 2016/0308543 | A1 * | 10/2016 | Ishihara | H03L 7/26 |
| 2018/0210403 | A1 * | 7/2018 | Maurice | H03L 7/26 |
| 2019/0068208 | A1 * | 2/2019 | Maki | G04F 5/14 |
| 2019/0181871 | A1 * | 6/2019 | Matsuda | G04F 5/145 |

FOREIGN PATENT DOCUMENTS

| | | | | |
|---|---|---|---|---|
| JP | 2015046535 | A | * | 3/2015 |
| JP | 2016092465 | A | | 5/2016 |
| JP | 2016207695 | A | | 12/2016 |
| JP | 2017098373 | A | * | 6/2017 |
| JP | 2018163910 | A | | 10/2018 |

OTHER PUBLICATIONS

Hirai et al. ("Alkali Metal Dispenser Utilizing Scalloped Silicon Groove for Microfabricated Vapor Cells", IEEE International Frequency Control Symposium, Published May 21, 2018). (Year: 2018).*

Hirai et al. ("Microfabrication of Alkali Vapor Cells With Lower The Outgassing And Temperature Utilizing Silicon 3D Structure", 2019 IEEE 32nd International Conference on Micro Electro Mechanical Systems (MEMS), pp. 350-353, 10.1109/MEMSYS.2019.8870676, Published Jan. 27, 2019). (Year: 2019).*

JP-2014110464-A, Machine Translation. (Year: 2026).*

JP-2017098373-A, Machine Translation. (Year: 2026).*

International Search Report and Written Opinion issued for International Patent Application No. PCT/JP2021/039690, Date of mailing: Jan. 18, 2022, 9 pages including English translation of Search Report.

* cited by examiner

METAL-GAS-FILLED CELL AND METHOD FOR MANUFACTURING THE SAME

TECHNICAL FIELD

The present invention relates to a metal-gas-filled cell and a method for manufacturing the same.

BACKGROUND ART

Research and development have been advanced around the world in relation to the miniaturization of various atomic sensor devices such as atomic clocks capable of achieving high-precision time synchronization and atomic magnetic sensors measuring the biomagnetism with high sensitivity. For example, an achievement in miniaturization of atomic clocks by Micro Electro Mechanical Systems (MEMS) fabrication technique would make it possible to replace existing crystal oscillators with atomic clocks. Atomic clocks are also expected to be used in various devices such as smartphones and microsatellites.

An atomic clock has, as its main component, a gas-filled cell in which a container is filled with an alkali metal gas and a buffer gas. In the case where $^{133}Cs$ is used as the alkali metal, it is possible to achieve an atomic clock having high precision as well as being miniature and power saving by using the coherent population trapping (CPT) resonance, which is the quantum-mechanical interference effect of Cs. One of the important indices indicating the performance of an atomic clock is the frequency stability. The frequency stability is evaluated separately in terms of short-term stability and long-term stability. The short-term stability is theoretically determined by the product of the Q value of the CPT resonance and the S/N ratio. The long-term stability is evaluated by, for example, the phenomenon in which the frequency varies due to the changes over time in both light quantity of the semiconductor laser for excitation, which is the measurement condition of the CPT resonance, and partial pressure of the buffer gas inside the gas-filled cell. For this reason, to enhance the performance of the atomic clock, a technique for producing a gas-filled cell is important.

Patent Literature 1 describes an example of conventional gas-filled cells. The alkali metal cell described in Patent Literature 1 includes a member made of Si having a cell internal portion, a pair of glass sheets attached to both the surfaces of the member made of Si, and an alkali metal raw material disposed inside the cell internal portion. The alkali metal raw material is solid $CsN_3$. Irradiating $CsN_3$ with UV light or laser light generates Cs vapor and $N_2$.

Patent Literature 1 (FIG. 11 and FIG. 12) also discloses a so-called two-chamber type gas-filled cell. The two-chamber type gas-filled cell has an optical chamber for irradiating an alkali metal gas with laser light and a chamber for charging the alkali metal raw material. The two-chamber type has the advantages of being capable of easily generating the alkali metal gas, remaining no raw material in the optical chamber, and so on, and thus is becoming the mainstream of gas-filled cells.

CITATION LIST

Patent Literature

Patent Literature 1: JP 2013-38382 A

SUMMARY OF INVENTION

Technical Problem

The method for generating Cs vapor using a decomposition reaction of $CsN_3$ has the advantage of being capable of generating high-purity Cs vapor. However, it is not easy to efficiently generate Cs vapor from solid $CsN_3$. For example, when $CsN_3$ is heated in a high vacuum and the temperature of $CsN_3$ thus reaches its melting point, 310° C., or higher, $CsN_3$ causes a decomposition reaction along with scattering. Accordingly, even when solid $CsN_3$ is heated at a high temperature, 600° C. or higher and 700° C. or lower, the Cs generation amount necessary for achieving the CPT resonance cannot be obtained. For this reason, it is usually necessary to generate Cs vapor slowly (for example, over 24 hours) by UV light irradiation.

The present invention aims to provide a technique for controlling to generate a metal gas more efficiently and in a shorter time while adopting a vapor generation method using a chemical reaction.

Solution to Problem

The present invention provides a method for manufacturing a metal-gas-filled cell including a cell main body, the cell main body including: a first surface; a second surface; an injection port that is a through hole extending from the first surface to the second surface; and a gas generating portion having a plurality of grooves that are open to the first surface, wherein the method includes:

attaching a first glass sheet to the first surface of the cell main body to cover the gas generating portion and the injection port;

injecting a raw material solution of a metal gas into the injection port to introduce the raw material solution into the gas generating portion with the first glass sheet being positioned below the gas generating portion in a vertical direction;

evaporating a solvent contained in the raw material solution to deposit a solid raw material of the metal gas in the gas generating portion; and attaching a second glass sheet to the second surface of the cell main body.

Another aspect of the present invention provides a metal-gas-filled cell including:

a cell main body including a first surface, a second surface, an injection port, and a gas generating portion;

a first glass sheet attached to the first surface of the cell main body;

a second glass sheet attached to the second surface of the cell main body;

an optical chamber provided in at least one selected from the cell main body, the first glass sheet, and the second glass sheet, the optical chamber communicating with the gas generating portion; and a metal gas filling the optical chamber, wherein the gas generating portion has a plurality of grooves that are open to the first surface, and the injection port has a through hole extending from the first surface to the second surface, and communicates with the gas generating portion.

Still another aspect of the present invention provides a metal-gas-filled cell including:

a cell main body including a first surface, an injection port, and a gas generating portion;

a glass sheet attached to the first surface of the cell main body;

an optical chamber provided in at least one selected from the cell main body and the glass sheet, the optical chamber communicating with the gas generating portion; and a metal gas filling the optical chamber, wherein the gas generating portion has a plurality of grooves that are open to the first surface, and the injection port is open to the first surface, and communicates with the gas generating portion.

Advantageous Effects of Invention

According to the present invention, it is possible to generate a metal gas more efficiently and in a shorter time.

DESCRIPTION OF EMBODIMENTS

Embodiments of the present invention will be described below with reference to the drawings. The present invention is not limited to the following embodiments.

First Embodiment

Figure 1:
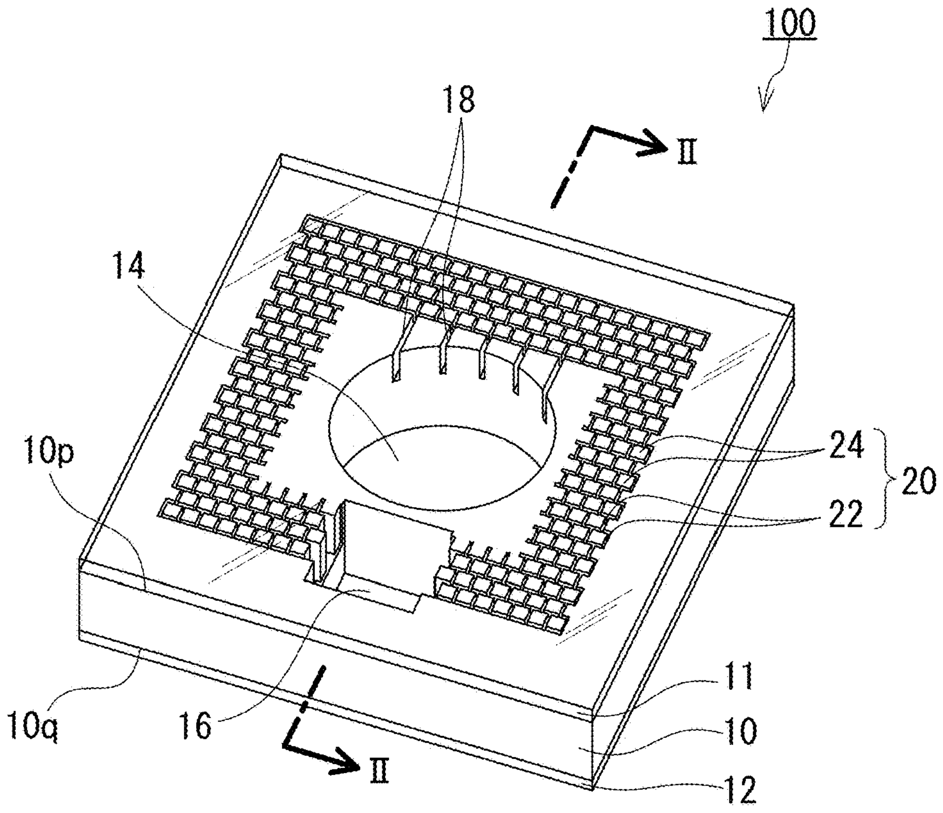
FIG. 1 is a perspective view of a metal-gas-filled cell according to a first embodiment of the present invention.
Figure 2:
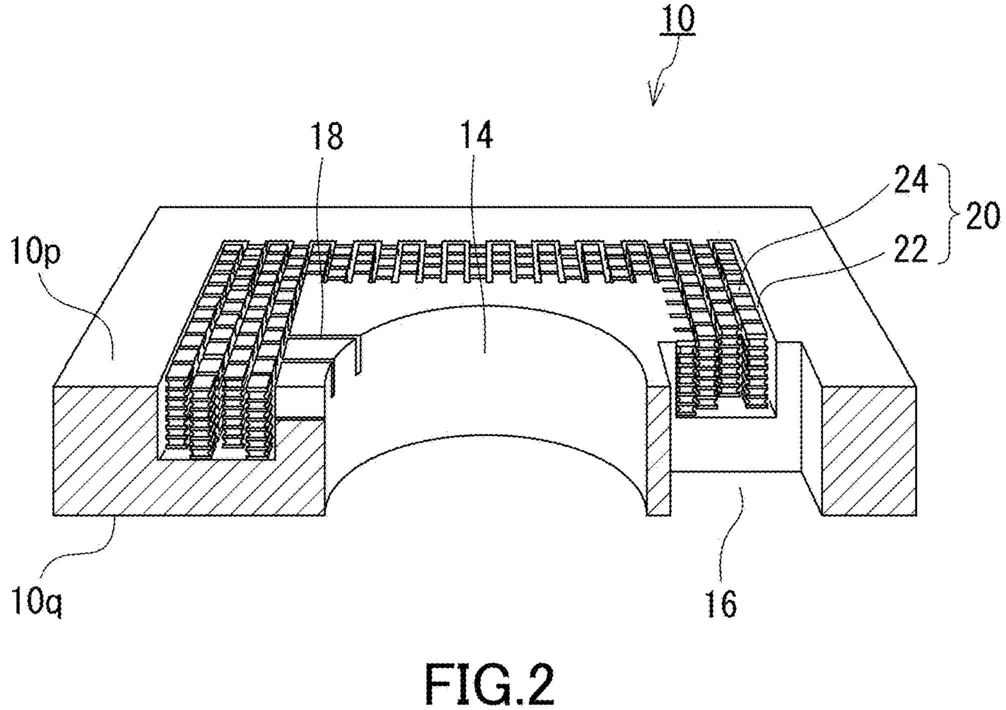
FIG. 2 is a cross-sectional perspective view of a cell main body taken along line II-II in FIG. 1.

FIG. 1 is a perspective view of a metal-gas-filled cell 100 according to a first embodiment of the present invention. FIG. 2 is a cross-sectional perspective view of a cell main body 10 taken along line II-II in FIG. 1. The metal-gas-filled cell 100 includes the cell main body 10, a first glass sheet 11, and a second glass sheet 12. The cell main body 10 has a first surface 10*p* and a second surface 10*q*. The first surface 10*p* and the second surface 10*q* are surfaces facing each other. The first surface 10*p* and the second surface 10*q* each may be the principal surface of the cell main body 10. The "principal surface" means the surface having the largest area. The first glass sheet 11 is attached to the first surface 10*p*. The second glass sheet 12 is attached to the second surface 10*q*.

In the present embodiment, the first glass sheet 11 entirely covers the first surface 10*p*, and the second glass sheet 12 entirely covers the second surface 10*q*. However, this is not required. The first surface 10*p* may include a portion that is not covered with the first glass sheet 11. The second surface 10*q* may include a portion that is not covered with the second glass sheet 12. These hold true for other embodiment and modifications, which will be described later.

The inside of the metal-gas-filled cell 100 is filled with a metal gas and a buffer gas. The metal gas typically includes an atomic alkali metal gas such as K gas, Rb gas, or Cs gas. Owing to the filling with the alkali metal gas, it is possible to cause the metal-gas-filled cell 100 to function as the atomic oscillator by detecting the CPT resonance. An example of the buffer gas is an inert gas. Examples of the inert gas include $H_2$ gas, $N_2$ gas, a noble gas, and a mixed gas thereof. The buffer gas is not required, and the metal-gas-filled cell 100 may be filled with only the metal gas.

The first glass sheet 11 and the second glass sheet 12 are each a thin glass sheet that sufficiently transmits light in a predetermined wavelength band. "Light in a predetermined wavelength band" means light to be emitted in actually using the metal-gas-filled cell 100. For example, when the metal gas is Cs gas, light in a predetermined wavelength band is light in the absorption wavelength band of Cs (Cs-D1 line, 894.6 nm). "Sufficiently transmitting" means, for example, that the transmittance of light in a predetermined wavelength band is 90% or higher. A glass sheet that is anodically bondable to the cell main body 10 can be used as the first glass sheet 11 and the second glass sheet 12. Examples of glass that is anodically bondable to silicon include silicate glass, borosilicate glass, aluminosilicate glass, and aluminoborosilicate glass.

The cell main body 10 is made of, for example, silicon. By using the MEMS fabrication technique, the plurality of metal-gas-filled cells 100 can be manufactured from one silicon wafer at the wafer level. Silicon is less subject to a reaction with an alkali metal gas and a buffer gas. Accordingly, in the case where the cell main body 10 is made of silicon, the internal atmosphere of the metal-gas-filled cell 100 can be kept stable and the vapor pressure of the alkali metal gas can be kept constant. Using a high-quality silicon wafer can promise to enhance the performance of the metal-gas-filled cell 100 as well. Further, in the case where the cell main body 10 is made of silicon, the first glass sheet 11 and the second glass sheet 12 can be attached to the cell main body 10 by anodic bonding without using any other bonding material. This also contributes to keeping the internal atmosphere of the metal-gas-filled cell 100 stable and keeping the vapor pressure of the alkali metal gas constant. However, the material of the cell main body 10 is not particularly limited. The cell main body 10 may be made of a metal such as stainless steel or glass as long as the material can be subjected to micromachining. The shape of the cell main body 10 is not particularly limited either. The cell main body 10 may be in the shape of a plate in plan view, a circular column, or a rectangular parallelepiped. The cell main body 10 in the shape of a rectangular parallelepiped means that a polyhedron surrounding the cell main body 10 and having the minimum volume is a rectangular parallelepiped. The method for bonding the first glass sheet 11 and the second glass sheet 12 to the cell main body 10 is not particularly limited either. At least one of the first glass sheet 11 and the second glass sheet 12 may be attached to the cell main body 10 by using a bonding material such as an adhesive agent, a glass frit, or a metal material. The method for bonding the cell main body 10 and the first glass sheet 11 to each other may be different from the method for bonding the cell main body 10 and the second glass sheet 12 to each other.

The cell main body 10 has an optical chamber 14, an injection port 16, and a gas generating portion 20. As will be described later, the optical chamber 14 may be provided in the first glass sheet 11 and/or the second glass sheet 12. The optical chamber 14 can be a portion that is provided in at least one selected from the cell main body 10, the first glass sheet 11, and the second glass sheet 12, and that communicates with the gas generating portion 20.

The optical chamber 14 is a portion filled with the metal gas and is the light path for detecting the CPT resonance. The optical chamber 14 is open to at least one of the first surface 10*p* and the second surface 10*q*. In the present embodiment, the optical chamber 14 is a through hole extending through the cell main body 10 from the first surface 10*p* to the second surface 10*q*. The cross-sectional area of the through hole may be constant or vary in the thickness direction of the cell main body 10. The through hole serving as the optical chamber 14 is positioned at the center of the cell main body 10. Alternatively, as will be described later, it is also possible to use, as the optical chamber, a bottomed hole that is open to only the first surface 10*p* or the second surface 10*q*. The shape of the optical chamber 14 is not particularly limited. The optical chamber 14 may be in the shape of a circle, an ellipse, or a polygon in plan view. The position of the optical chamber 14 is not particularly limited either, and the optical chamber may be provided at a position deviated from the center of the cell main body 10.

The injection port 16 is a portion for receiving the raw material solution of the metal gas. The injection port 16 is a through hole extending from the first surface 10*p* to the second surface 10*q*. By providing the injection port 16, which is a through hole, it is possible to avoid a direct introduction of the raw material solution into the gas generating portion 20, thereby preventing the first surface 10*p* of the cell main body 10 from being contaminated by the raw material solution. This enhances the production yield of the metal-gas-filled cell 100. The injection port 16 is separated from the optical chamber 14. The injection port 16 communicates with the gas generating portion 20 directly or indirectly via another channel. The shape of the injection port 16 is not particularly limited. The injection port 16 may be in the shape of a polygon as shown in the figure, a circle, or an ellipse in plan view. In the first surface 10*p*, the injection port 16 has a smaller opening area than the optical chamber 14 has. Such a structure contributes to the miniaturization of the metal-gas-filled cell 100. However, the sizes of the optical chamber 14 and the injection port 16 are not particularly limited.

The gas generating portion 20 is a portion for generating the solid raw material of the metal gas from the raw material solution of the metal gas and generating the metal gas from the solid raw material. The gas generating portion 20 may define at least a portion of the path from the injection port 16 to the optical chamber 14. The gas generating portion 20 has a plurality of grooves 22 that are open to the first surface 10*p*. The plurality of grooves 22 are bottomed grooves. In the present embodiment, the gas generating portion 20 is in the shape of a frame surrounding the optical chamber 14 in plan view. One end and the other end of the gas generating portion 20 face the injection port 16. In other words, the injection port 16 is provided to penetrate a portion of the frame-shaped gas generating portion 20.

The gas generating portion 20 has a plurality of pillars 24 in addition to the plurality of grooves 22. Specifically, the plurality of grooves 22 extend in a grid pattern in plan view so that the gas generating portion 20 has the plurality of pillars 24. In the present embodiment, the plurality of grooves 22 are fabricated so that the plurality of pillars 24 are arranged in a staggered pattern. According to such a fine structure, it is possible to sufficiently ensure the area of the surface on which the solid raw material of the metal gas is to be deposited. The pillar 24 is in the shape a rectangle (typically a square) in plan view. However, the shape of the pillar 24 is not particularly limited. The pillar 24 may be in the shape of a rectangular column or a circular column.

Figure 3A:
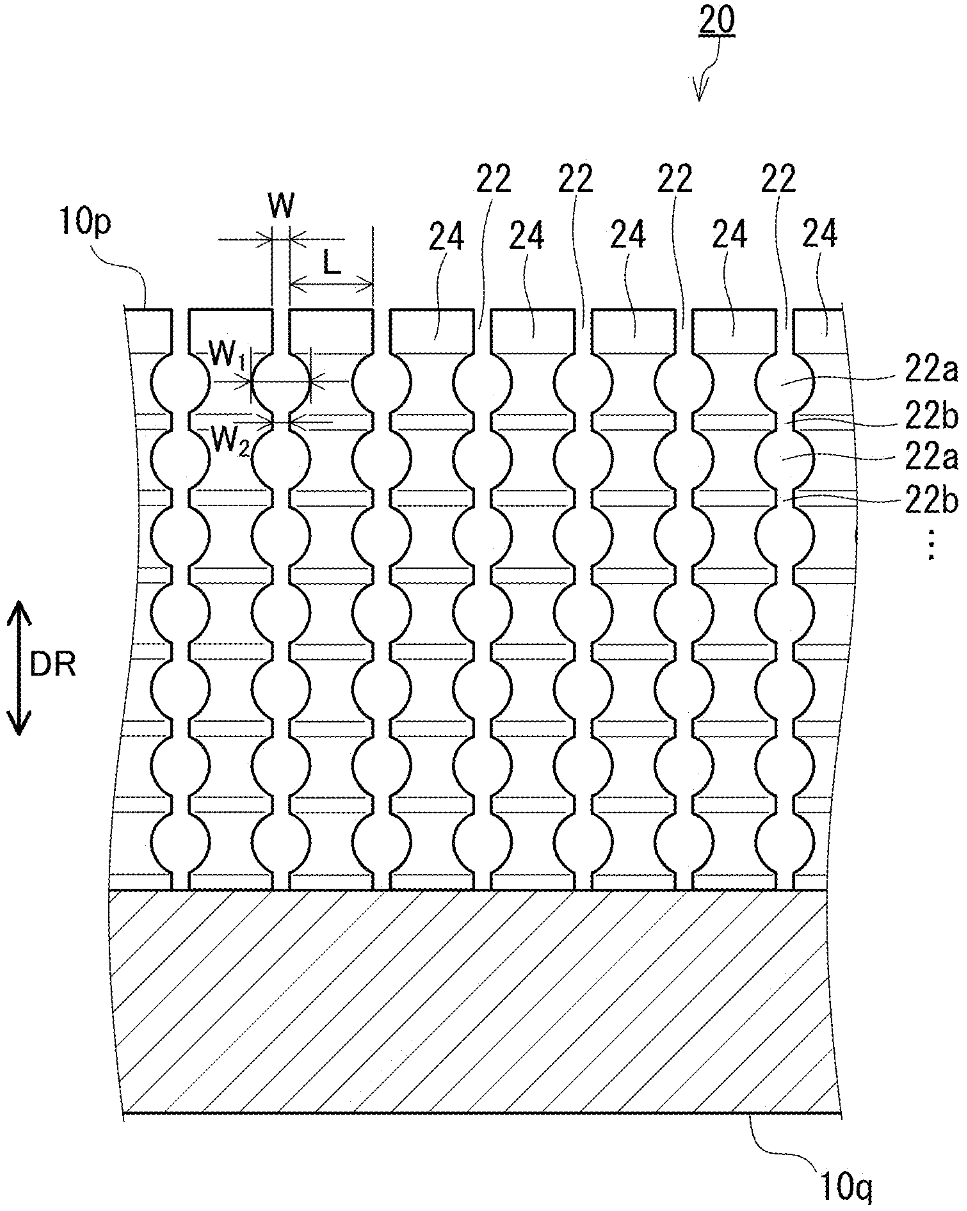
FIG. 3A is a partially enlarged view of a gas generating portion.

FIG. 3A is a partially enlarged view of the gas generating portion 20. As shown in FIG. 3A, the width of each of the plurality of grooves 22 cyclically varies along a thickness direction DR of the cell main body 10. The thickness direction DR of the cell main body 10 is the direction from the first surface 10*p* toward the second surface 10*q*. The plurality of grooves 22 each have a portion larger in width than an opening width W of each of the plurality of grooves 22 in the first surface 10*p*. Specifically, the plurality of grooves 22 each include a plurality of first portions 22*a* and a plurality of second portions 22*b*. The first portion 22*a* is a portion having a long distance between the adjacent pillars 24. The second portion 22*b* is a portion having a short distance between the adjacent pillars 24. The first portion 22*a* and the second portion 22*b* are alternately provided from the first surface 10*p* toward the second surface 10*q*. A width W2 of the second portion 22*b* of the groove 22 is, for example, equal to the opening width W of the groove 22 in the first surface 10*p*. In the present embodiment, seven stages of the first portions 22*a* are provided along the thickness direction DR. However, the number of the first portions 22*a* and the second portions 22*b* is not particularly limited.

In generating the solid raw material from the raw material solution of the metal gas, the solid raw material tends to adhere to the fine structure defining the gas generating portion 20 to remain in the gas generating portion 20. Further, the fine structure of the gas generating portion 20 increases the efficiency of a chemical reaction caused by heating of the solid raw material such as $CsN_3$. Owing to the combined effect of an increase in specific surface area and a prevention of scattering of the solid raw material during the thermal decomposition, it is possible to efficiently generate an alkali metal gas even at a low temperature through the chemical reaction of the solid raw material.

The width W of the groove 22 in the first surface 10*p* is, for example, 1 μm or more and 100 μm or less. A width W1 of the first portion 22*a* of the groove 22 is, for example, 5 μm or more and 200 μm or less. The width W2 of the second portion 22*b* of the groove 22 is approximately equal to the width W of the groove 22 in the first surface 10*p*. The width W1 of the first portion 22*a* and the width W2 of the second portion 22*b* may gradually decrease from the first surface 10*p* toward the second surface 10*q*. The length of one side L of the pillar 24 in the first surface 10*p* is, for example, 50 μm or more and 500 μm or less.

Figure 3B:
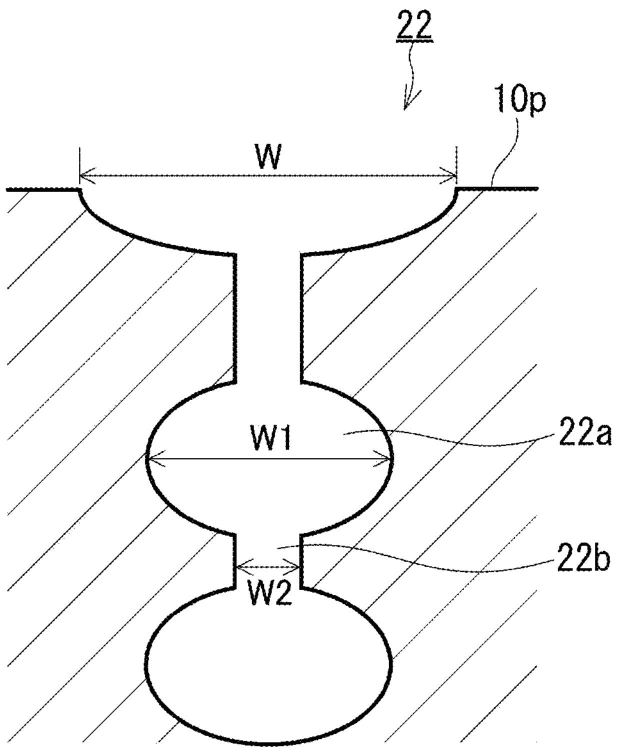
FIG. 3B is a partially enlarged view showing another example of the structure of a groove.

However, the relation among the width W of the groove 22 in the first surface 10*p*, the width W1 of the first portion 22*a* of the groove 22, and the width W2 of the second portion 22*b* of the groove 22 is not particularly limited. FIG. 3B is a partially enlarged view showing another example of the structure of the groove 22. As shown in FIG. 3B, the opening portion of the groove 22 in the first surface 10*p* may be expanded by etching in advance, and then reactive ion etching, which will be described later, may be performed so that the first portion 22*a* and the second portion 22*b* are fabricated. In this case, the opening width W of the groove 22 in the first surface 10*p* is larger than the width W1 of the first portion 22*a* and larger than the width W2 of the second portion 22*b*. According to such a structure, even an accumulation of the solid raw material such as $CsN_3$ on the opening portion of the groove 22 tends not to interfere with bonding between the cell main body 10 and the first glass sheet 11.

As shown in FIG. 1 and FIG. 2, a microchannel 18 is provided between the optical chamber 14 and the gas generating portion 20 to allow them to communicate with each other. In the present embodiment, a plurality of grooves that are open to the first surface 10*p* each serve as the microchannel 18. The groove serving as the microchannel 18 has a width that is, for example, smaller than the width W of the groove 22 in the gas generating portion 20. Such a structure helps to hinder the solid raw material or raw material solution of the metal gas from being introduced into the optical chamber 14. The groove serving as the microchannel 18 has a width of, for example, 1 μm or more and 30 μm or less. The position of the microchannel 18 is not particularly limited. In the present embodiment, the microchannel 18 is provided 180 degrees opposite of the injection port 16 with respect to the optical chamber 14. Accordingly, the raw material in solid or liquid form of the metal gas is less prone to be introduced into the optical chamber 14. The microchannel 18 may be defined by only one groove.

Next, a method for manufacturing the metal-gas-filled cell 100 will be described.

Figure 4A:
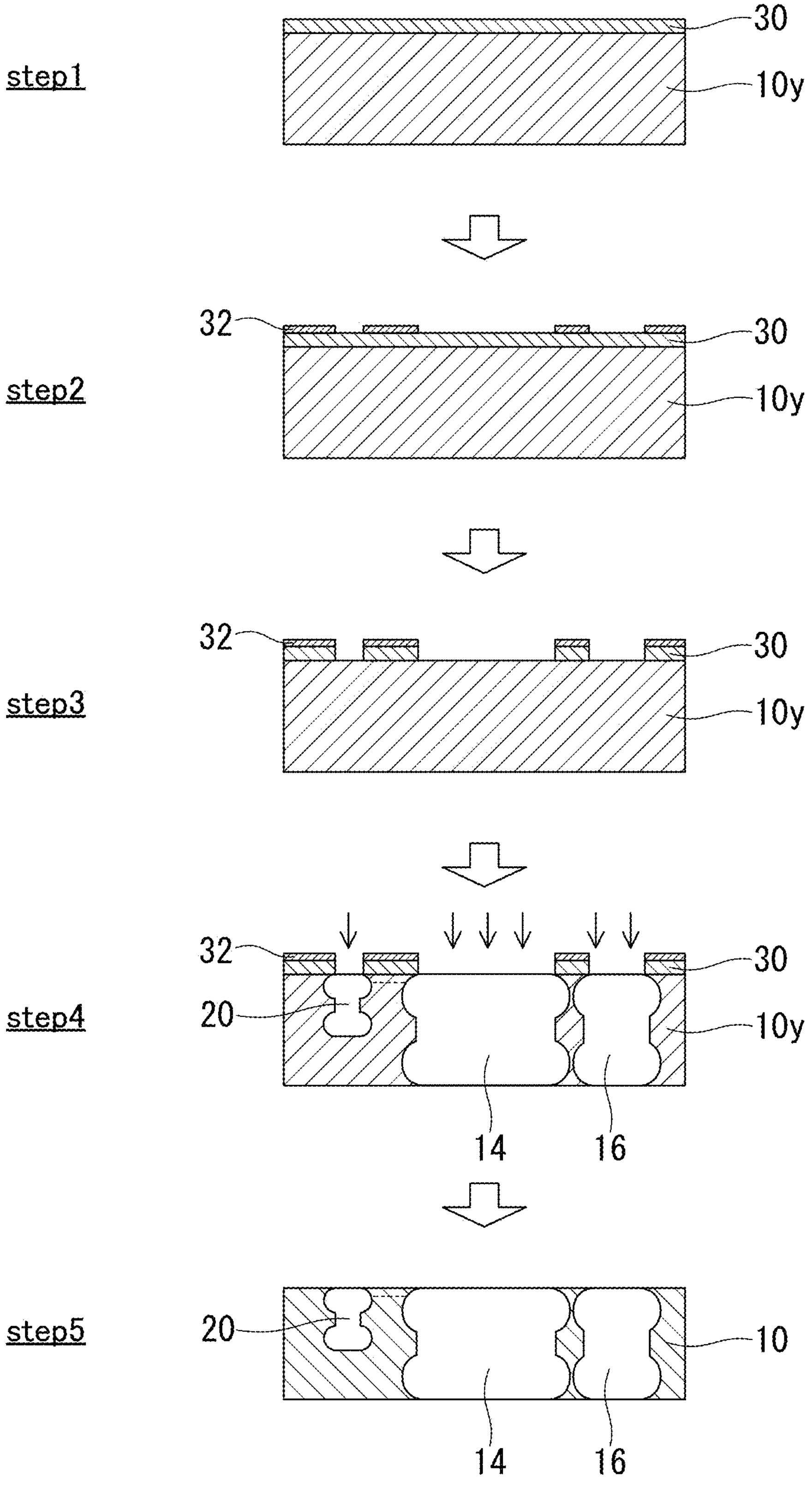
FIG. 4A is a process diagram showing a method for manufacturing the metal-gas-filled cell.
Figure 4B:
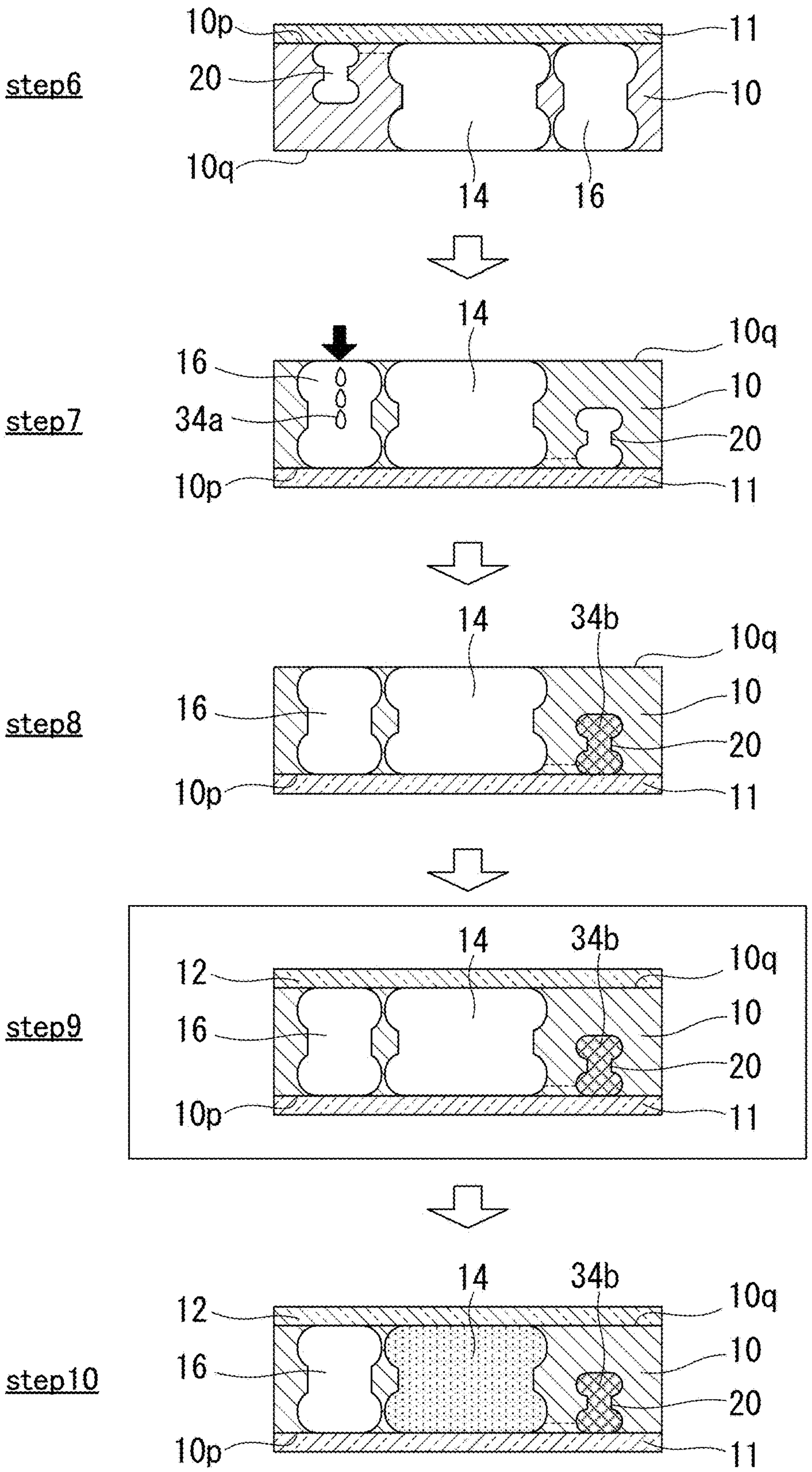
FIG. 4B is a process diagram continuing from FIG. 4A.

FIG. 4A and FIG. 4B are process diagrams showing a method for manufacturing the metal-gas-filled cell 100. Specifically, FIG. 4A shows a method for manufacturing the cell main body 10. FIG. 4B shows a method for manufacturing the metal-gas-filled cell 100 by using the cell main body 10.

As shown in step 1 of FIG. 4A, a thin film 30 as the mask is formed on one surface of a substrate 10*y*. The thin film 30 may be a thin film of a metal such as Cr, Al, or Ni, or may be a silicon oxide film. The thin film 30 can be formed by a vapor phase method such as vapor deposition or sputtering. The substrate 10*y* is, for example, a silicon wafer. Since the plurality of metal-gas-filled cells 100 can be manufactured from the one substrate 10*y*, the method of the present embodiment is excellent in productivity. The silicon wafer serving as the substrate 10*y* may be a polycrystalline wafer or a single-crystal wafer. Using the single-crystal wafer makes it possible to keep the internal atmosphere of the metal-gas-filled cell 100 more stable and keep the vapor pressure of the alkali metal gas more constant. No grain boundary in the single-crystal wafer facilitates the fabrication of the fine structure of the gas generating portion 20 with high dimensional accuracy. The larger the size of the substrate 10*y* is, the more the mass production of the miniaturized metal-gas-filled cell 100 can be performed.

Next, as shown in step 2, a resist 32 is applied onto the surface of the thin film 30 and the resist 32 is patterned by photolithography. The thin film 30 may be omitted to form the resist 32 directly on the substrate 10*y*.

Next, as shown in step 3, a portion of the thin film 30 is removed with an etchant to expose the surface of the substrate 10*y*.

Next, as shown in step 4, the optical chamber 14, the injection port 16, and the gas generating portion 20 are fabricated by deep reactive ion etching. In the present embodiment, in preparing the cell main body 10, the optical chamber 14, the injection port 16, and the gas generating portion 20 are collectively fabricated by deep reactive ion etching. This makes it possible to manufacture the cell main body 10 with a small number of processes. In the case where the optical chamber 14 is provided in the first glass sheet 11 and/or the second glass sheet 12, the injection port 16 and the gas generating portion 20 are fabricated in step 4. The microchannel 18 is fabricated in step 4 as well.

In the case where the optical chamber 14, the injection port 16, and the gas generating portion 20 are collectively fabricated, irregularities are provided not only in the gas generating portion 20 but also on the inner peripheral surface of the optical chamber 14 and the inner peripheral surface of the injection port 16. In response to this, the following method is less prone to generate irregularities on the inner peripheral surface of the optical chamber 14 and the inner peripheral surface of the injection port 16, though including an increased number of processes. That is, the gas generating portion 20 is fabricated by performing deep reactive ion etching from one surface (first surface) of the substrate 10*y*. The optical chamber 14 and the injection port 16 are fabricated by performing deep reactive ion etching from the other surface (second surface) of the substrate 10*y*. By simply digging into the substrate 10*y*, it is possible to form, as the optical chamber 14 and the injection port 16, through holes each having a flat inner peripheral surface.

Figure 5:
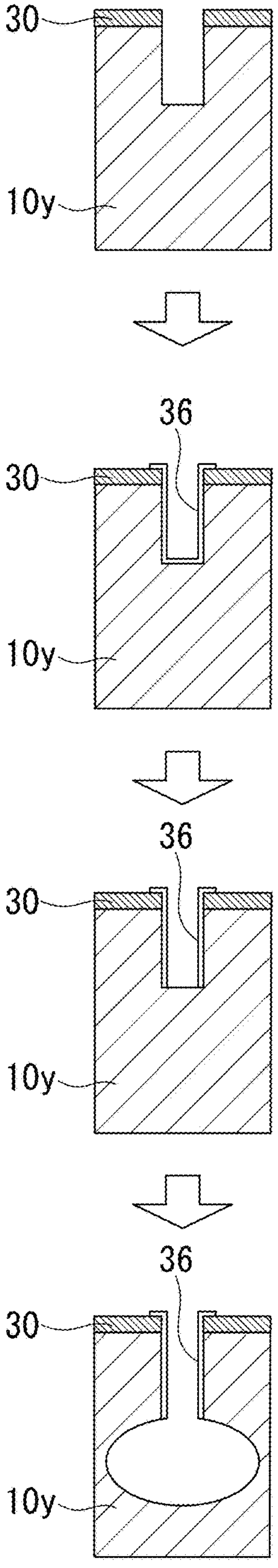
FIG. 5 is a diagram showing the process sequence for fabricating the gas generating portion by deep reactive ion etching.

FIG. 5 is a diagram showing the process sequence for fabricating the gas generating portion 20 by deep reactive ion etching. First, etching using sulfur hexafluoride ($SF_6$) and formation of a protective film using a fluorocarbon ($C_4F_8$) are repeated multiple times to form a groove. Next, a thick protective film 36 is formed on the inner peripheral surface of the groove by using the fluorocarbon. Next, the protective film 36 on the bottom surface of the groove is removed by using sulfur hexafluoride, and isotropic etching is performed. By repeating these processes multiple times, it is possible to fabricate the gas generating portion 20 having the fine structure described with reference to FIG. 3A. Instead of the fluorocarbon, an alternative gas such as $CHF_3$ gas or $CFI_3$ gas may be used.

As shown in step 5, the thin film 30 and the resist 32 are removed to obtain the cell main body 10.

Next, as shown in step 6 of FIG. 4B, the first glass sheet 11 is attached to the first surface 10*p* of the cell main body 10 to cover the plurality of grooves 22 of the gas generating portion 20 and the injection port 16. In the present embodiment, since the optical chamber 14 is also open to the first surface 10*p*, the optical chamber 14, the gas generating portion 20, and the injection port 16 are covered with the first glass sheet 11. The method for bonding the first glass sheet 11 and the cell main body 10 to each other is anodic bonding. In anodic bonding, the first glass sheet 11 and the cell main body 10 are overlaid each other, and a direct-current voltage is applied between them while heating them. The heating temperature is, for example, 150° C. or higher and 600° C. or lower. The applied voltage is, for example, 200 V or higher and 1200 V or lower.

The first glass sheet 11 may match the first surface 10*p* of the cell main body 10 in terms of dimensions in plan view. By attaching the first glass sheet 11 and the cell main body 10 to each other, not only the first surface 10*p* of the cell main body 10 except a portion corresponding to the gas generating portion 20 but also the upper surfaces of the plurality of pillars 24 of the gas generating portion 20 are bonded to the first glass sheet 11.

Next, as shown in step 7, a raw material solution 34*a* of the metal gas is injected into the injection port 16 to introduce the raw material solution 34*a* into the gas generating portion 20 with the first glass sheet 11 being positioned below the gas generating portion 20 in the vertical direction. The raw material solution 34*a* is injected into the injection port 16 from the second surface 10*q* side. The first glass sheet 11 serves as the bottom portion of the gas generating portion 20, and accordingly the raw material solution 34*a* does not overflow through the groove 22.

The raw material solution 34*a* is a solution containing a metal compound. Examples of the metal compound include a metal azide such as $CsN_3$ and a metal halide such as CsCl. The metal compound is typically an alkali metal compound. In the present embodiment, an alkali metal gas is generated by using a chemical reaction of an alkali metal compound. For example, when the alkali metal is Cs, a $CsN_3$ solution is introduced into the gas generating portion 20 of the cell main body 10 to deposit solid $CsN_3$. The solvent in the $CsN_3$ solution may be an inorganic solvent such as water, or may be an organic solvent such as alcohol, acetone, or acetonitrile. When solid $CsN_3$ is heated in a vacuum, Cs and $N_2$ are generated according to the following chemical reaction. The method for generating an alkali metal by thermal decomposition of a metal azide has the advantage of being capable of simultaneously generating an alkali metal gas and $N_2$ gas as the buffer gas to fill the cell main body 10 without generating any product which would exert influence on the performance such as the gas pressure inside the metal-gas-filled cell 100.

$$2CsN_3 \rightarrow 2Cs+3N_2 \quad (1)$$

The alkali metal compound is not limited to a metal azide. For example, as shown in the following formula (2), Cs gas can be generated by reacting CsCl and $BaN_6$ with each other. However, the method for generating an alkali metal by thermal decomposition of a metal azide has the advantage of generating no by-product except an alkali metal and $N_2$ and thus causing no influence of the by-product on the gas pressure.

$$BaN_6+2CsCl \rightarrow 2Cs+BaCl_2+3N_2 \quad (2)$$

Next, in step 8, the solvent contained in the raw material solution 34*a* is evaporated to deposit a solid raw material 34*b* of the metal gas in the gas generating portion 20. Specifically, the solvent is evaporated by heating the cell main body 10. The heating of the cell main body 10 can be achieved by placing the cell main body 10 on a hot plate or processing the cell main body 10 in a heating furnace.

Figure 6A:
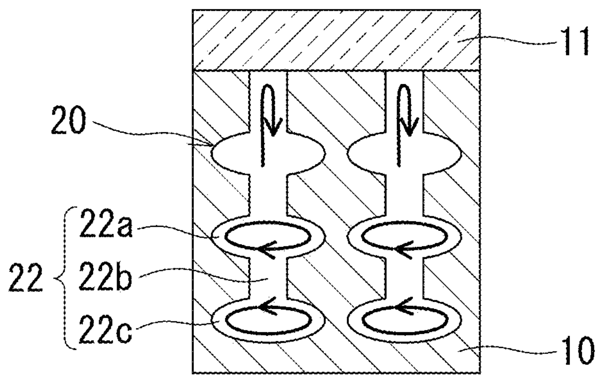
FIG. 6A is a diagram schematically showing the action of the gas generating portion exerted in the case where the raw material solution is introduced into the gas generating portion and the cell main body is heated.

FIG. 6A is a diagram schematically showing the action of the gas generating portion 20 exerted in the case where the raw material solution 34*a* is introduced into the gas generating portion 20 and the cell main body 10 is heated. The arrow in the figure represents the flow of the raw material solution 34*a* and the vapor generated from the raw material solution 34*a*. As shown in FIG. 6A, according to the manufacturing method of the present embodiment, since the groove 22 of the gas generating portion 20 is closed with the first glass sheet 11, the raw material solution 34*a* does not overflow to the outside of the gas generating portion 20. The solid raw material 34*b* can be generated from almost the entire amount of the injected raw material solution 34*a*, and accordingly a sufficient amount of the solid raw material 34*b* can be deposited in the gas generating portion 20.

The heating temperature for the cell main body 10 for depositing the solid raw material 34*b* in the gas generating portion 20 is, for example, 25° C. or higher and 315° C. or lower. According to the present embodiment, even when the cell main body 10 is heated at a relatively high temperature to boil the raw material solution 34*a*, the raw material solution 34*a* is less likely to overflow from the gas generating portion 20. The "heating temperature" is the temperature of the surroundings where the cell main body 10 is placed. In the case where a hot plate is used, the heating temperature is the surface temperature of the hot plate. In the case where a heating furnace is used, the heating temperature is the temperature inside the heating furnace.

Figure 6B:
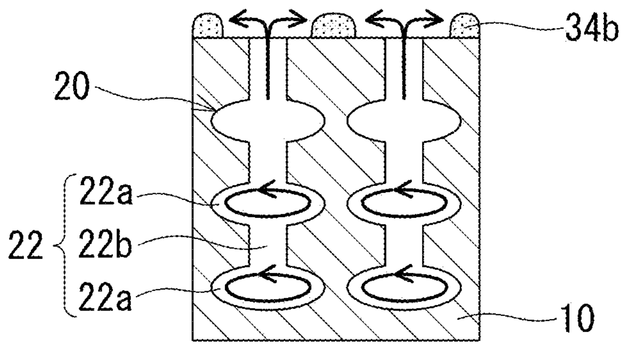
FIG. 6B is a diagram schematically showing the action of the gas generating portion exerted in the case where the solid raw material is deposited by using the cell main body that is not closed with a first glass sheet.

Note that FIG. 6B is a diagram schematically showing the action of the gas generating portion 20 exerted in the case where the solid raw material 34*b* is deposited by using the cell main body 10 that is not closed with the first glass sheet 11. In the case where the first glass sheet 11 is not provided and the groove 22 is open toward the outside, the raw material solution 34*a* sometimes overflows through the groove 22. This makes it necessary to preliminarily inject an excessive amount of the raw material solution 34*a* into the gas generating portion 20. Further, it is necessary to directly inject the raw material solution 34*a* into the gas generating portion 20 with a device such as a micropipette. This process is extremely complicated. Further, the solid raw material 34*b* of the metal gas adheres to the surface of the cell main body 10. The solid raw material 34*b* hinders the anodic bonding between the first glass sheet 11 and the cell main body 10, and accordingly the solid raw material 34*b* which has overflown from the gas generating portion 20 needs to be removed. This, of course, causes an insufficiency of the amount of the solid raw material 34*b* to be deposited in the gas generating portion 20. According to the method of the present embodiment, it is possible to avoid such disadvantages.

Next, in step 9, the second glass sheet 12 is attached to the second surface 10*q* of the cell main body 10. The second glass sheet 12 may match the second surface 10*q* of the cell main body 10 in terms of dimensions in plan view. The method for bonding the second glass sheet 12 and the cell main body 10 to each other is anodic bonding as well. In anodic bonding, the second glass sheet 12 and the cell main body 10 are overlaid each other, and a direct-current voltage is applied between them while heating them. The heating temperature is, for example, 150° C. or higher and 300° C. or lower. The applied voltage is, for example, 200 V or higher and 1200 V or lower. The process in step 9 is performed in a vacuum or in an atmosphere of an inert gas such as a noble gas or $N_2$ gas. The degree of vacuum is, for example, $1\times10^{-3}$ Pa or higher and $1\times10^{-7}$ Pa or lower.

Lastly, in step 10, the metal gas is generated from the solid raw material 34*b*, and the metal gas is introduced into the optical chamber 14. Specifically, the metal gas is generated from the solid raw material 34*b* by heating the cell main body 10. The heating of the cell main body 10 can be achieved by placing the cell main body 10 on a hot plate or treating the cell main body 10 in a heating furnace. The heating temperature for the cell main body 10 for generating the metal gas is, for example, 250° C. or higher and 400° C. or lower. Note that instead of by heating the cell main body 10, the metal gas may be generated by decomposing the solid raw material 34*b* through UV light irradiation, or the metal gas may be generated by decomposing the solid raw material 34*b* through laser light irradiation.

In the case where the metal gas is generated by heating the cell main body 10, the attachment of the second glass sheet 12 to the second surface 10*q* of the cell main body 10 should desirably be performed at a temperature lower than the heating temperature for heating the cell main body 10 to generate the metal gas. Specifically, the attachment of the second glass sheet 12 to the second surface 10*q* of the cell main body 10 should desirably be performed at a temperature lower than the decomposition temperature of the solid raw material 34*b*. By keeping the temperature of the cell main body 10 lower than the decomposition temperature of the solid raw material 34*b* in attaching the second glass sheet 12 to the second surface 10*q*, it is possible to prevent the generation of the gas from the solid raw material 34*b*, thereby preventing the increase in pressure inside the metal-gas-filled cell 100. This can prevent the damage to the metal-gas-filled cell 100. In particular, the pressure difference between the inside and the outside of the metal-gas-filled cell 100 tends to increase in a vacuum, and accordingly it is significant to prevent the generation of the gas in attaching the second glass sheet 12 to the cell main body 10. Further, by maintaining the temperature lower than the decomposition temperature of the solid raw material 34*b*, the bonding surface (the second surface 10*q*) for the anodic bonding is immune from a contamination by the alkali metal gas or the solid raw material 34*b* which has scattered.

Through the above processes, the metal-gas-filled cell 100 of the present embodiment is obtained. A portion of the solid raw material 34*b* remains undecomposed in the gas generating portion 20. That is, the metal-gas-filled cell 100 has the solid raw material 34*b* of the metal gas, where the solid raw material 34*b* is adherent to the gas generating portion 20. According to the present embodiment, neither member nor material except the solid raw material 34*b* is present inside the metal-gas-filled cell 100. This makes it possible to keep the internal atmosphere of the metal-gas-filled cell 100 stable and keep the vapor pressure of the alkali metal gas constant. Owing to the solid raw material 34*b* remaining in the gas generating portion 20, in the case where the vapor pressure of the metal gas in the optical chamber 14 decreases due to the deterioration over time, it is also possible to compensate for the metal gas by reheating the metal-gas-filled cell 100.

Note that the process in step 10 may be performed immediately before using the metal-gas-filled cell 100. That is, it is also conceivable that the processes up to step 9 are performed by the manufacturer and only the process in step 10 is performed by the user.

Figure 4C:
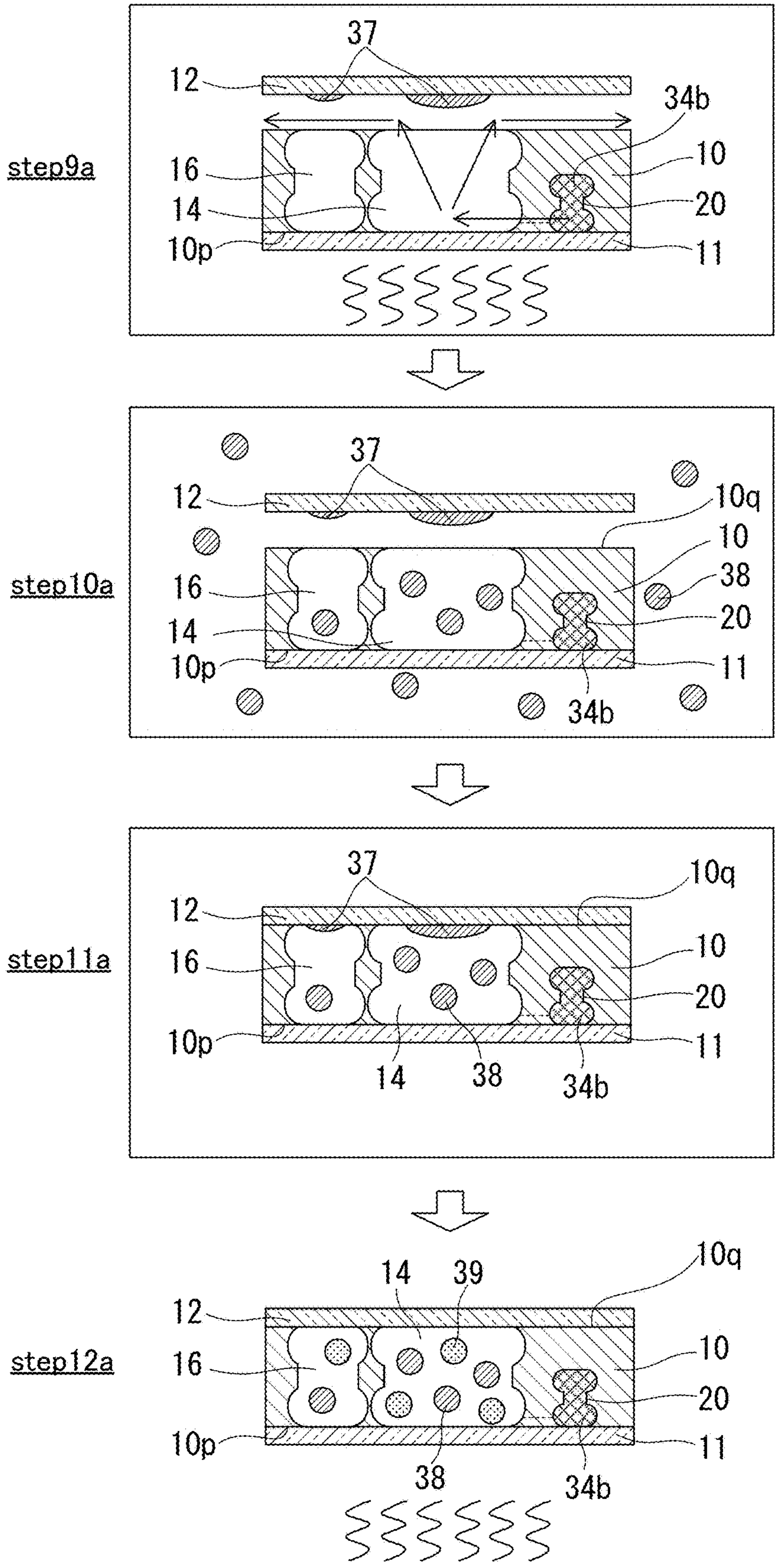
FIG. 4C is a process diagram showing a method for manufacturing the metal-gas-filled cell according to a modification.

FIG. 4C is a process diagram showing a method for manufacturing the metal-gas-filled cell 100 according to a modification. The processes up to step 8 in the present modification are as described with reference to FIG. 4A and FIG. 4B. As shown in step 9*a* of FIG. 4C, in the present modification, the solid raw material 34*b* is deposited in the gas generating portion 20, and then the metal gas is generated from the solid raw material 34*b*. Specifically, the metal gas is generated from the solid raw material 34*b* by heating the cell main body 10. At this time, the second glass sheet 12 is placed above the second surface 10*q* of the cell main body 10 so that the metal gas generated comes into contact with the surface of the second glass sheet 12 and thus a thin metal film 37 is accumulated on the surface of the second glass sheet 12. The arrow in step 9*a* represents the flow of the metal gas generated. The process in step 9*a* is performed in a vacuum or in an atmosphere of an inert gas such as a noble gas or $N_2$ gas. The degree of vacuum is, for example, $1\times10^{-3}$ Pa or higher and $1\times10^{-7}$ Pa or lower.

Next, as shown in step 10*a*, the cell main body 10 and the second glass sheet 12 are placed in an atmosphere of an inert gas 38 such as $N_2$ gas.

Next, as shown in step 11*a*, the second glass sheet 12 is attached to the second surface 10*q* of the cell main body 10. This process is as described with reference to step 9 in FIG. 4B.

Lastly, in step 12*a*, the cell main body 10 is heated to the driving temperature of the metal-gas-filled cell 100. Accordingly, a metal gas 39 is supplied from the thin metal film 37 on the surface of the second glass sheet 12 to the optical chamber 14. The present modification has the advantages of being capable of using a desired inert gas, achieving a desired gas ratio, and sealing the optical chamber 14 under the optimum gas pressure.

Figure 7:
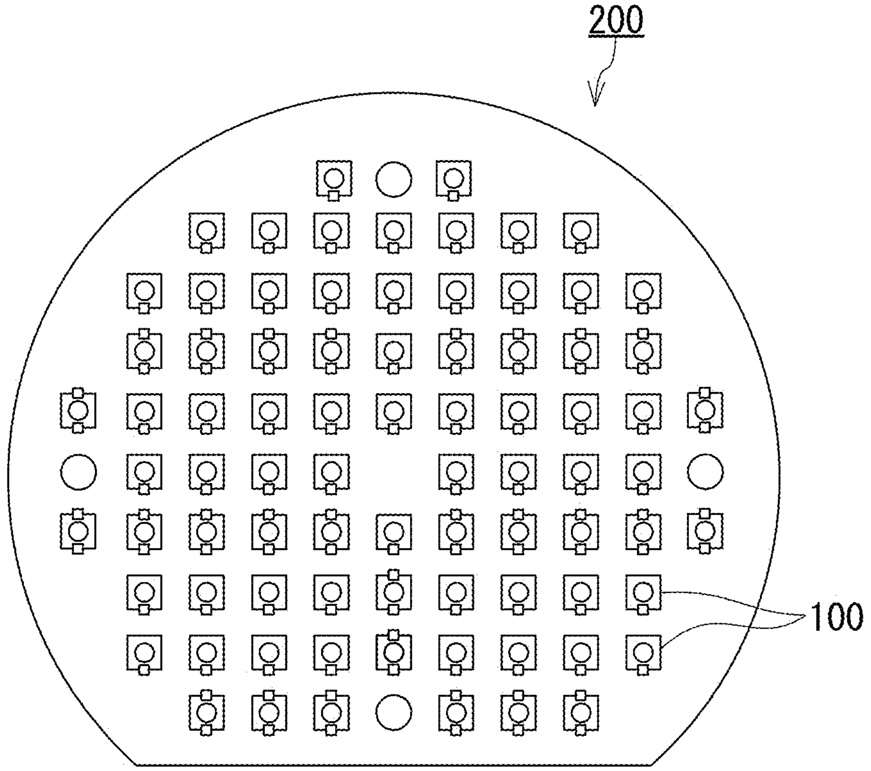
FIG. 7 is a plan view of an aggregate including the plurality of metal-gas-filled cells.

FIG. 7 is a plan view of an aggregate 200 including the plurality of metal-gas-filled cells 100. The plurality of metal-gas-filled cells 100 are obtained from one silicon wafer. By cutting the aggregate 200 along a predetermined cut line, the aggregate 200 can be separated into the individual metal-gas-filled cells 100. The aggregate 200 shown in FIG. 7 includes a metal-gas-filled cell having a design different from that of the metal-gas-filled cell 100 described with reference to FIG. 1. That is, it is also possible to produce a plurality of metal-gas-filled cells having different designs on one silicon wafer by the MEMS fabrication technique. Of course, the aggregate 200 may include only the metal-gas-filled cell 100 having a single design. The process of cutting the aggregate 200 may be performed before the process in step 10 (FIG. 4B) for generating the metal gas, or may be performed after the process in step 10. According to the method of the present embodiment, it is possible to perform the selection.

Some modifications will be described below. The elements common to the embodiment and the modifications are denoted by the same reference numerals, and the descriptions thereof may be omitted. The descriptions on the embodiment and the modifications can be applied to each other unless they are technically contradictory. The embodiment and the modifications may be combined with each other unless they are technically contradictory.

(Modifications)

Figure 8:
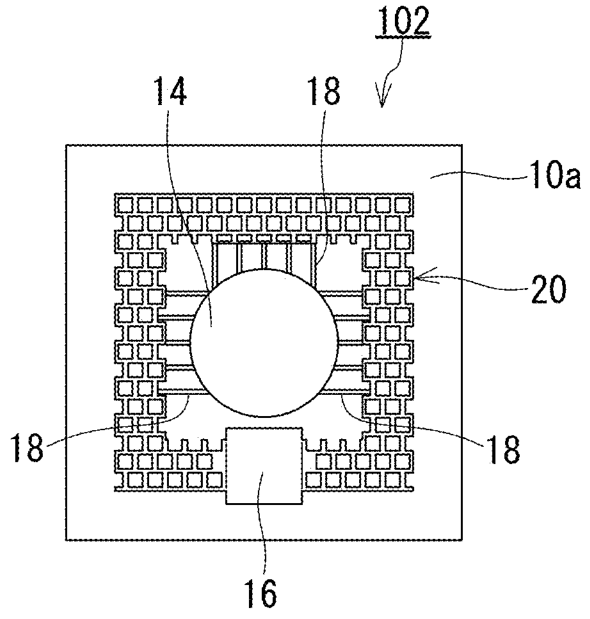
FIG. 8 is a plan view of a metal-gas-filled cell according to Modification 1.

FIG. 8 is a plan view of a metal-gas-filled cell 102 according to Modification 1. In the metal-gas-filled cell 102, a cell main body 10*a* has the three microchannels 18 each having a plurality of grooves. The gas generating portion 20 is in the shape of a rectangular frame in plan view. The injection port 16 is provided in one side of the rectangular frame. The microchannel 18 is provided at each of three locations around the optical chamber 14 to allow each of the other three sides and the optical chamber 14 to communicate with each other.

Figure 9:
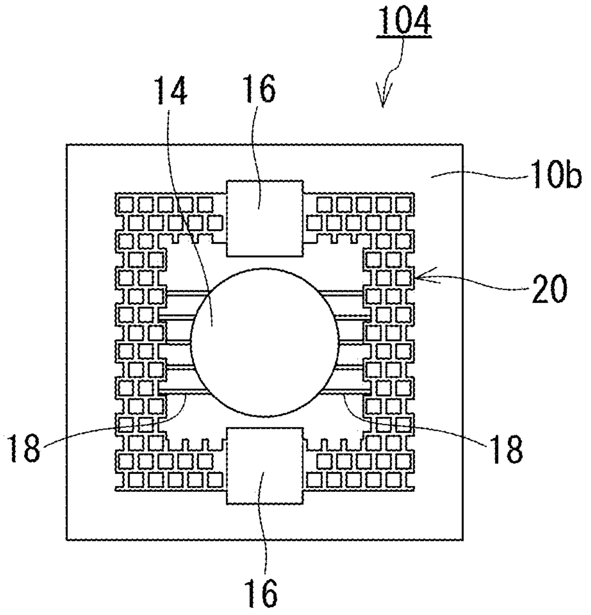
FIG. 9 is a plan view of a metal-gas-filled cell according to Modification 2.

FIG. 9 is a plan view of a metal-gas-filled cell 104 according to Modification 2. In the metal-gas-filled cell 104, a cell main body 10*b* has the two microchannels 18 and the plurality of (two) injection ports 16. The injection ports 16 are disposed at regular angular intervals around the optical chamber 14. In FIG. 9, since the number of the injection ports 16 is two, the injection port 16 is provided at each of the 0-degree position and the 180-degree position with respect to the optical chamber 14 in plan view. The microchannel 18 is provided at each of the 90-degree position and the 270-degree position with respect to the optical chamber 14 in plan view. Such a structure makes it possible to reduce the injection amount of the $CsN_3$ aqueous solution in each of the injection ports 16, and accordingly the $CsN_3$ aqueous solution is less prone to leak through the injection port 16 during the heating.

Figure 10:
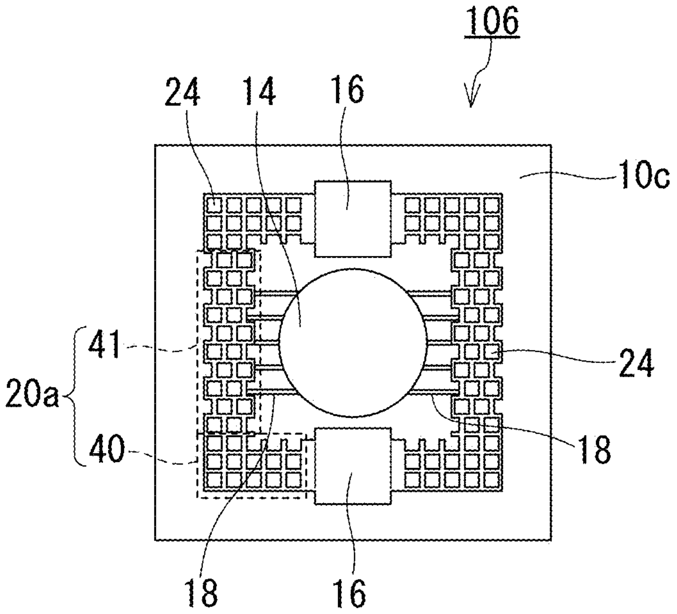
FIG. 10 is a plan view of a metal-gas-filled cell according to Modification 3.

FIG. 10 is a plan view of a metal-gas-filled cell 106 according to Modification 3. In the metal-gas-filled cell 106, a gas generating portion 20*a* of a cell main body 10*c* includes a first region 40 and a second region 41. The arrangement pattern of the plurality of pillars 24 in the first region 40 is different from the arrangement pattern of the plurality of pillars 24 in the second region 41. In the example shown in FIG. 10, in the first region 40, the plurality of pillars 24 are disposed to form a square grid. In the second region 41, the plurality of pillars 24 are disposed in a staggered pattern. In the path from the injection port 16 to the optical chamber 14, the first region 40 and the second region 41 are arranged in this order. Improving the arrangement pattern of the plurality of pillars 24 facilitates the deposition of the solid raw material 34*b* from the raw material solution 34*a* of the metal gas, and facilitates the progress of the decomposition reaction of the solid raw material 34*b*.

Figure 11A:
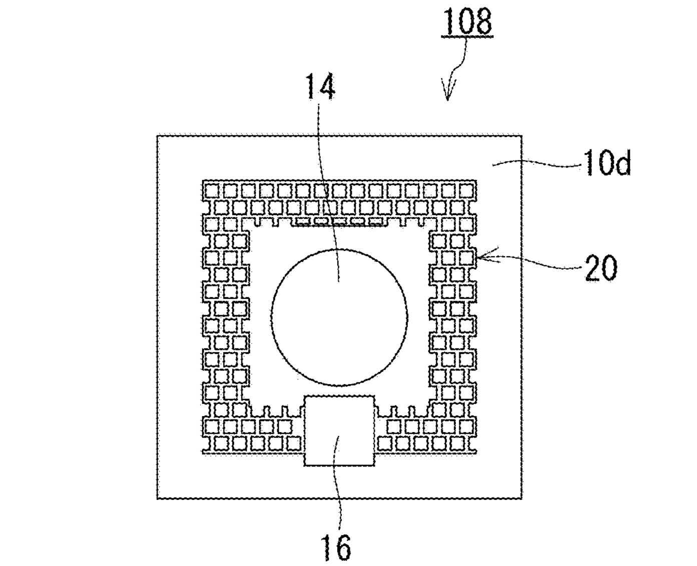
FIG. 11A is a plan view (top view) of a metal-gas-filled cell according to Modification 4.
Figure 11B:
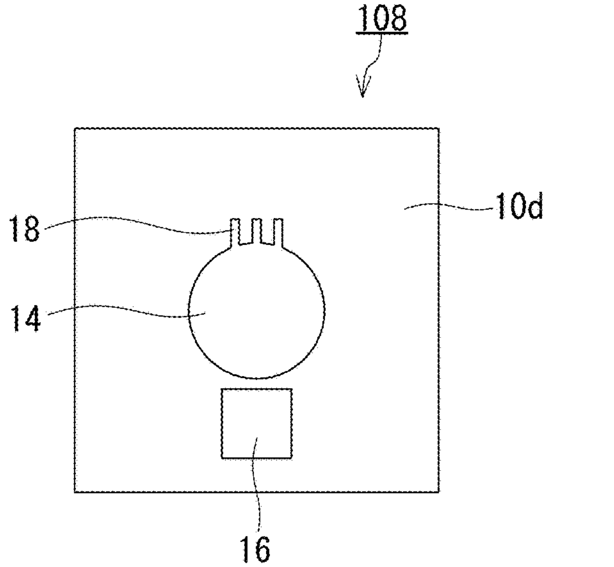
FIG. 11B is a bottom view of the metal-gas-filled cell according to Modification 4.
Figure 11C:
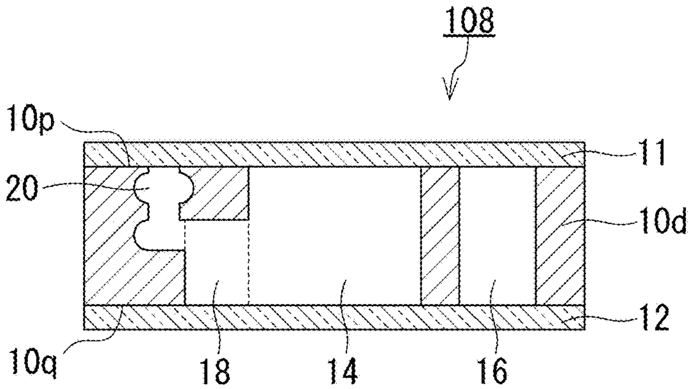
FIG. 11C is a cross-sectional view of the metal-gas-filled cell according to Modification 4.

FIG. 11A is a plan view (top view) of a metal-gas-filled cell 108 according to Modification 4. FIG. 11B is a bottom view of the metal-gas-filled cell 108 according to Modification 4. FIG. 11C is a cross-sectional view of the metal-gas-filled cell 108 according to Modification 4. In the metal-gas-filled cell 108, a cell main body 10*d* has the microchannel 18 that is open to the second surface 10*q*. The gas generating portion 20 is open to the first surface 10*p*. The bottom portion of the microchannel 18 and the bottom portion of the gas generating portion 20 communicate with each other inside the cell main body 10*d*. In other words, the sum of the depth of the microchannel 18 and the depth of the gas generating portion 20 exceeds the thickness of the cell main body 10*d*. Accordingly, the gas generating portion 20 and the optical chamber 14 communicate with each other via the microchannel 18. For example, the gas generating portion 20 is fabricated by performing deep reactive ion etching from the first surface 10*p* side. The optical chamber 14, the injection port 16, and the microchannel 18 are fabricated by performing deep reactive ion etching from the second surface 10*q* side. Thus, the cell main body 10*d* is obtained.

Figure 12A:
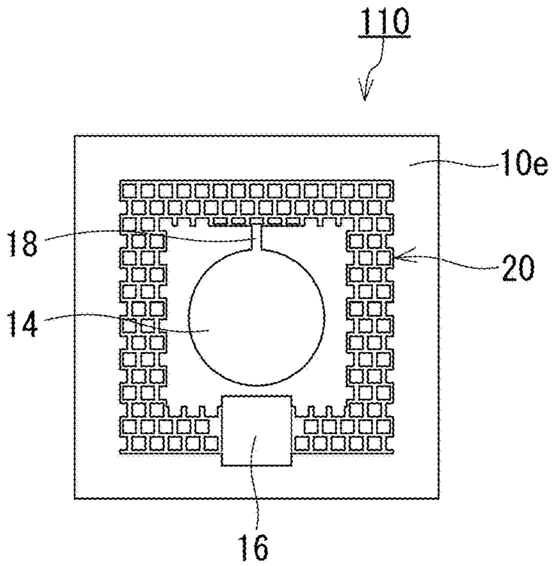
FIG. 12A is a plan view (top view) of a metal-gas-filled cell according to Modification 5.
Figure 12B:
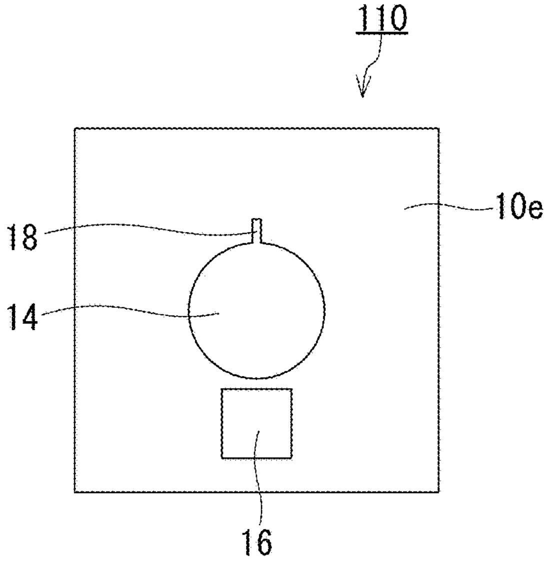
FIG. 12B is a bottom view of the metal-gas-filled cell according to Modification 5.
Figure 12C:
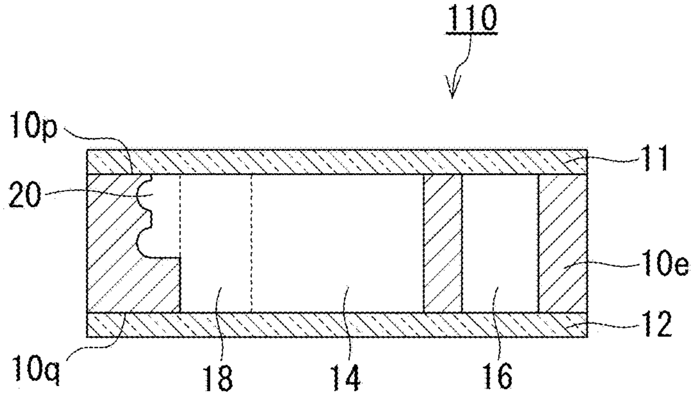
FIG. 12C is a cross-sectional view of the metal-gas-filled cell according to Modification 5.

FIG. 12A is a plan view (top view) of a metal-gas-filled cell 110 according to Modification 5. FIG. 12B is a bottom view of the metal-gas-filled cell 110 according to Modification 5. FIG. 12C is a cross-sectional view of the metal-gas-filled cell 110 according to Modification 5. In the metal-gas-filled cell 110, a cell main body 10*e* has the microchannel 18 that is open to both the first surface 10*p* and the second surface 10*q*. That is, in the present modification, the microchannel 18 is a through hole. In the case where the optical chamber 14, the injection port 16, and the microchannel 18 are through holes, the cell main body 10*e* is easily manufactured.

Figure 13A:
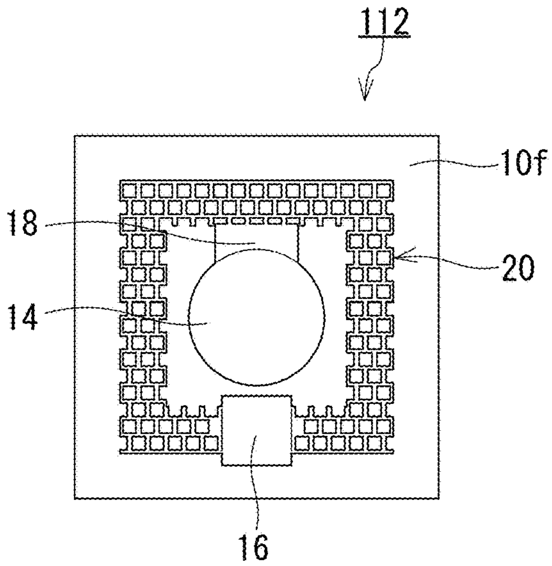
FIG. 13A is a plan view (top view) of a metal-gas-filled cell according to Modification 6.
Figure 13B:
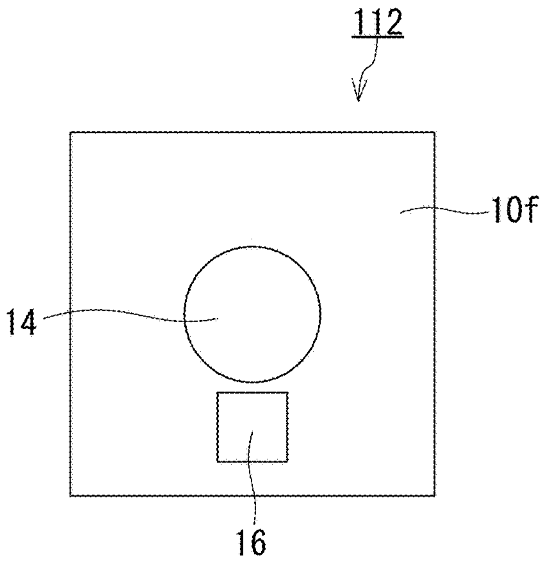
FIG. 13B is a bottom view of the metal-gas-filled cell according to Modification 6.
Figure 13C:
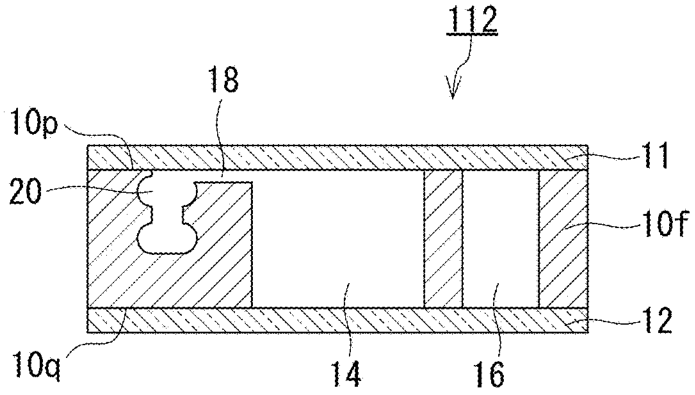
FIG. 13C is a cross-sectional view of the metal-gas-filled cell according to Modification 6.

FIG. 13A is a plan view (top view) of a metal-gas-filled cell 112 according to Modification 6. FIG. 13B is a bottom view of the metal-gas-filled cell 112 according to Modification 6. FIG. 13C is a cross-sectional view of the metal-gas-filled cell 112 according to Modification 6. In the metal-gas-filled cell 112, a cell main body 10*f* has the microchannel 18 that is open to the first surface 10*p*. The microchannel 18 has a depth of, for example, 10 μm or less. The microchannel 18 has a width sufficiently larger than its depth. In the present modification, the microchannel 18 is a shallow groove having a large width.

In this manner, as long as the microchannel 18 allows the gas generating portion 20 and the optical chamber 14 to communicate with each other, the disposition and shape of the microchannel 18 are not particularly limited. Further, the microchannel may be provided in the first glass sheet 11, or the microchannel may be provided in both the cell main body and the first glass sheet 11.

Figure 14:
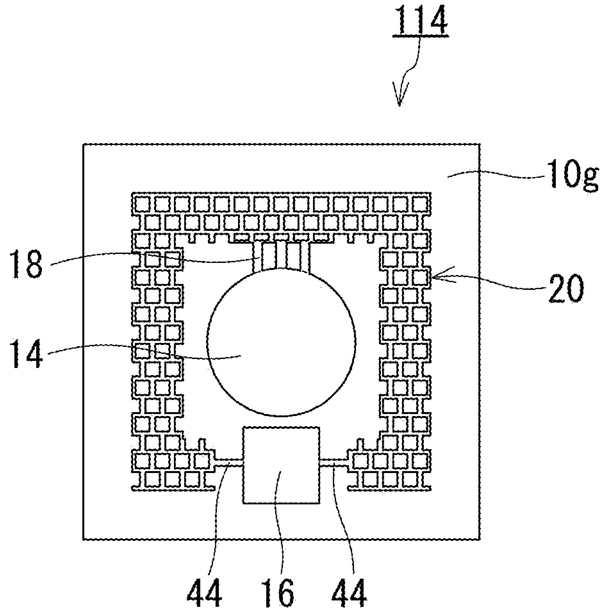
FIG. 14 is a plan view of a metal-gas-filled cell according to Modification 7.

FIG. 14 is a plan view of a metal-gas-filled cell 114 according to Modification 7. In the metal-gas-filled cell 114, a cell main body 10*g* has a joining portion 44 that is positioned between the injection port 16 and the gas generating portion 20 to allow them to communicate with each other. The joining portion 44 has, for example, a groove that is open to the first surface 10*p*. As in the cell main body 10*g*, the injection port 16 and the gas generating portion 20 may communicate with each other indirectly via the joining portion 44.

Figure 15:
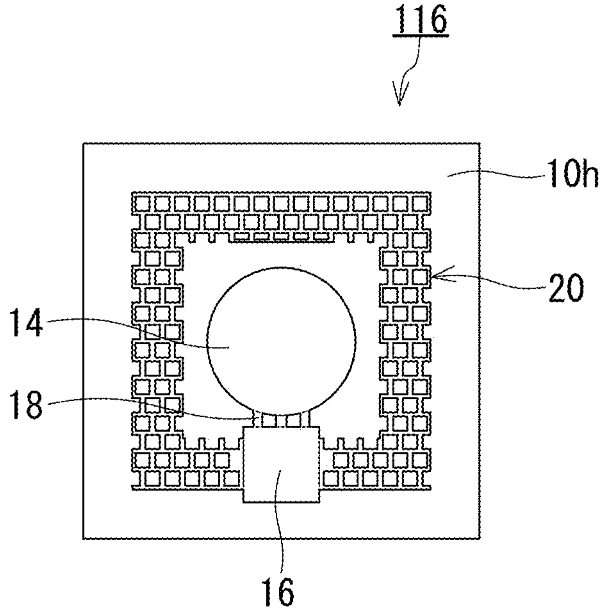
FIG. 15 is a plan view of a metal-gas-filled cell according to Modification 8.

FIG. 15 is a plan view of a metal-gas-filled cell 116 according to Modification 8. In the metal-gas-filled cell 116, the microchannel 18 of a cell main body 10*h* allows the optical chamber 14 and the gas generating portion 20 to communicate with each other via the injection port 16. By appropriately determining the width and depth of the groove serving as the microchannel 18, it is possible to send the metal gas and the buffer gas to the optical chamber 14 while hindering the raw material solution 34*a* from directly entering the optical chamber 14 through the injection port 16.

Figure 16:
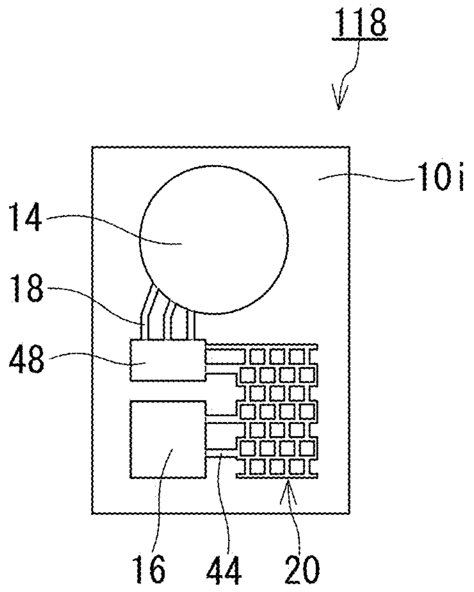
FIG. 16 is a plan view of a metal-gas-filled cell according to Modification 9.

FIG. 16 is a plan view of a metal-gas-filled cell 118 according to Modification 9. In the metal-gas-filled cell 118, a cell main body 10*i* has an additional chamber 48 that is positioned between the microchannel 18 and the gas generating portion 20. The additional chamber 48 is, for example, a through hole, and serves to hinder $CsN_3$ in liquid or solid form leaked from the gas generating portion 20 from entering the optical chamber 14 through the microchannel 18. The injection port 16 and the gas generating portion 20 communicate with each other via the joining portion 44. As in the present modification, the optical chamber 14 may not be surrounded by the gas generating portion 20.

Figure 17:
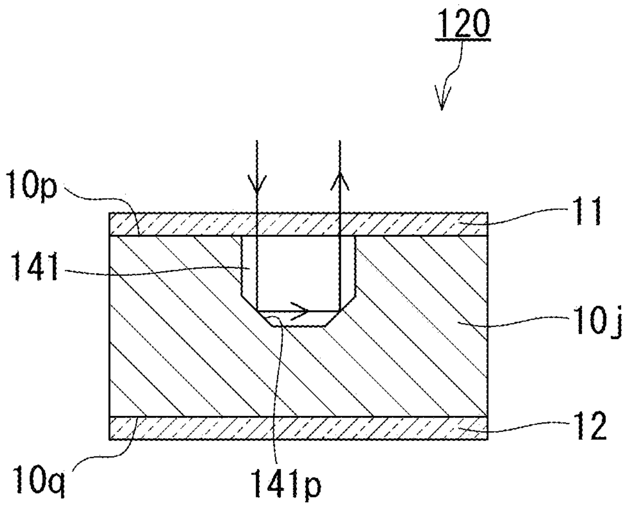
FIG. 17 is a plan view of a metal-gas-filled cell according to Modification 10.

FIG. 17 is a plan view of a metal-gas-filled cell 120 according to Modification 10. In the metal-gas-filled cell 120, a cell main body 10*j* has an optical chamber 141 defined by a bottomed hole. In the bottom portion of the bottomed hole serving as the optical chamber 141, an inclined portion 141*p* that reflects light is provided. The surface of the inclined portion 141*p* is a mirror surface. Alternatively, a metal film for increasing the light reflectivity may be provided on the surface of the inclined portion 141*p*. Light transmits through the first glass sheet 11 to travel to the optical chamber 141, repeatedly reflects from the inclined portion 141*p*, and again transmits through the first glass sheet 11 to travel to the outside of the metal-gas-filled cell 120.

Figure 18:
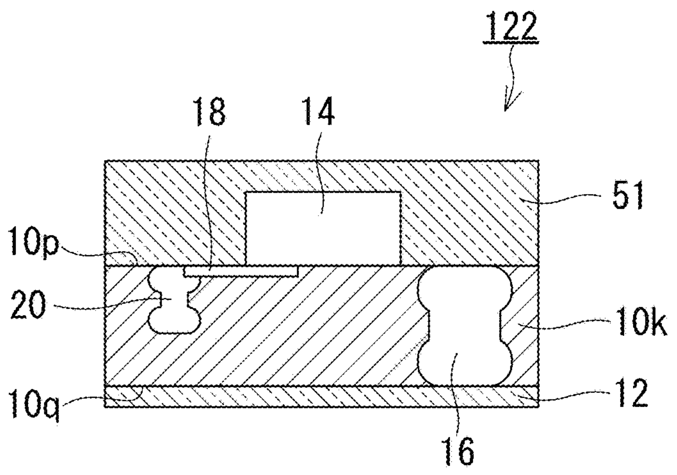
FIG. 18 is a cross-sectional view of a metal-gas-filled cell according to Modification 11.

FIG. 18 is a cross-sectional view of a metal-gas-filled cell 122 according to Modification 11. The metal-gas-filled cell 122 includes a cell main body 10*k*, a first glass sheet 51, and the second glass sheet 12. The first glass sheet 51 has the optical chamber 14. The optical chamber 14 is filled with the metal gas. The optical chamber 14 of the first glass sheet 51 communicates with the gas generating portion 20 via the microchannel 18. The depth of the optical chamber 14 is adjusted so that laser light emitted in an in-plane direction perpendicular to the thickness direction of the metal-gas-filled cell 122 can pass through the optical chamber 14. The first glass sheet 51 may be a glass cube in the shape of a rectangular parallelepiped, a circular column, or the like.

When the thickness direction of the metal-gas-filled cell 122 is defined as the Z direction, a plane parallel to the first surface 10*p* and the second surface 10*q* is the X-Y plane. By performing laser light irradiation in both the X-axis direction and the Y-axis direction of the X-Y plane, it is also possible to apply the metal-gas-filled cell 122 to optically pumped atomic magnetic sensors.

Figure 19:
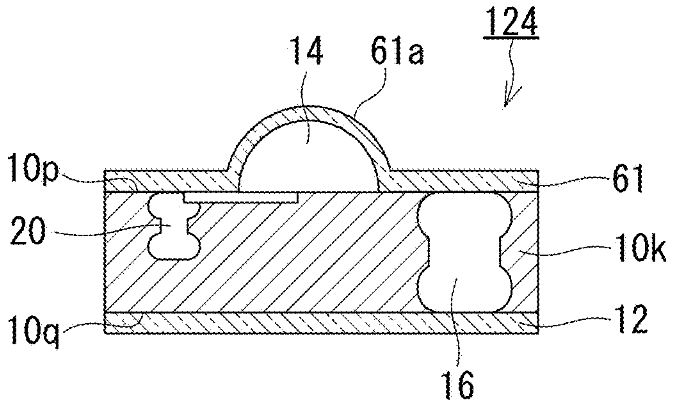
FIG. 19 is a cross-sectional view of a metal-gas-filled cell according to Modification 12.

FIG. 19 is a cross-sectional view of a metal-gas-filled cell 124 according to Modification 12. The metal-gas-filled cell 124 includes a first glass sheet 61 having the optical chamber 14 as well. The first glass sheet 61 has a dome-shaped protrusion 61*a*. Owing to the dome-shaped protrusion 61*a*, a space functioning as the optical chamber 14 is ensured.

As can be understood from FIG. 18 and FIG. 19, the "glass sheet" as used herein is not necessarily limited to a glass sheet thinner than the cell main body. Further, the glass sheet may have a protrusion or a recess for the optical chamber.

Figure 20:
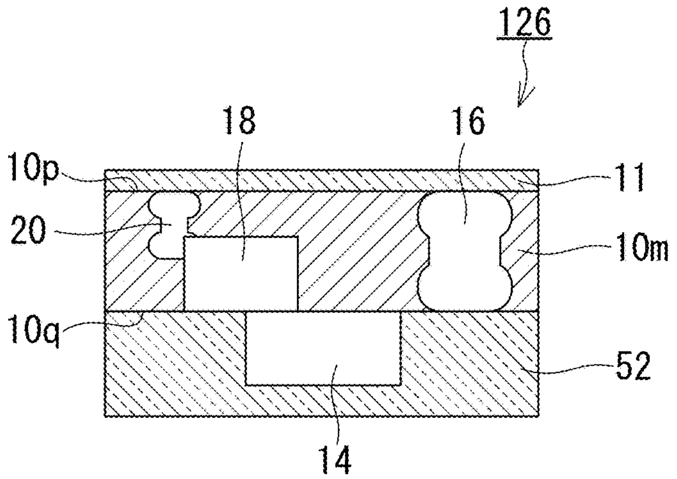
FIG. 20 is a cross-sectional view of a metal-gas-filled cell according to Modification 13.

FIG. 20 is a cross-sectional view of a metal-gas-filled cell 126 according to Modification 13. The metal-gas-filled cell 126 includes a cell main body 10*m*, the first glass sheet 11, and a second glass sheet 52. The second glass sheet 52 has an optical chamber 14.

As can be understood from FIG. 1, FIG. 19, and FIG. 20, the position of the optical chamber 14 is not particularly limited. The optical chamber 14 may be provided in at least one selected from the cell main body, the first glass sheet, and the second glass sheet. For example, a portion of the optical chamber 14 may be provided in the first glass sheet and the remaining portion of the optical chamber 14 may be provided in the cell main body. However, in the case where the optical chamber 14 is provided in the cell main body 10 (FIG. 1), the metal-gas-filled cell 100 is easily reduced in thickness. The trouble of processing the glass sheet can also be saved.

Figure 21A:
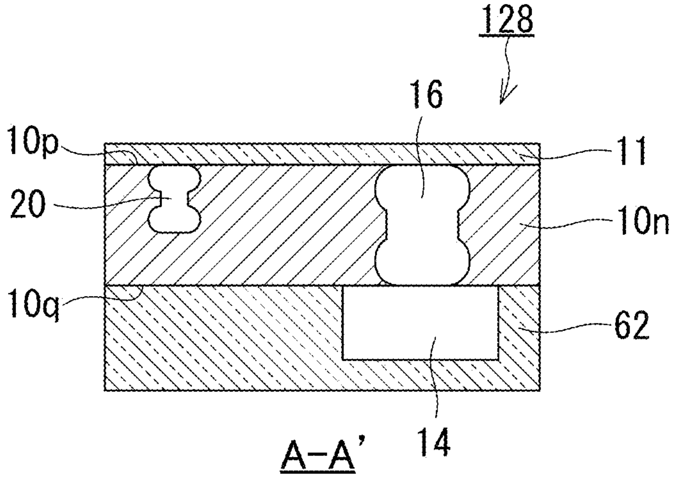
FIG. 21A is a cross-sectional view of a metal-gas-filled cell according to Modification 14 taken along line A-A'.
Figure 21B:
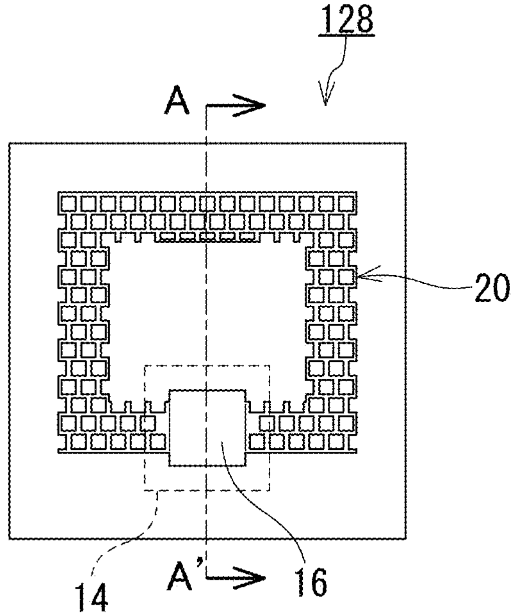
FIG. 21B is a plan view (top view) of the metal-gas-filled cell according to Modification 14.

FIG. 21A is a cross-sectional view of a metal-gas-filled cell 128 according to Modification 14 taken along line A-A'. FIG. 21B is a plan view (top view) of the metal-gas-filled cell 128 according to Modification 14. The metal-gas-filled cell 128 includes a cell main body 10*n*, the first glass sheet 11, and a second glass sheet 62. The second glass sheet 62 has the optical chamber 14. The optical chamber 14 and the injection port 16 overlay each other in an in-plane direction parallel to the first surface 10*p* and the second surface 10*q*. In the present modification, the optical chamber 14 and the injection port 16 overlay each other in the second surface 10*q*. When the metal-gas-filled cell 128 is viewed in plan, the injection port 16 is placed inside the optical chamber 14. No microchannel is provided in the cell main body 10*n*. The injection port 16 also serves as the path from the gas generating portion 20 to the optical chamber 14. Such a structure makes it possible to omit the microchannel.

The method for manufacturing the metal-gas-filled cell 128 is as described with reference to FIG. 4A and FIG. 4B. That is, the first glass sheet 11 is attached to the first surface 10*p* of the cell main body 10*n*, and the raw material solution 34*a* of the metal gas is injected into the injection port 16 to introduce the raw material solution 34*a* into the gas generating portion 20. The solvent contained in the raw material solution 34*a* is evaporated to deposit the solid raw material 34*b* of the metal gas in the gas generating portion 20. The second glass sheet 62 is attached to the second surface 10*q* of the cell main body 10*n*. The metal gas is generated from the solid raw material 34*b*, and the metal gas is introduced into the optical chamber 14.

Figure 22A:
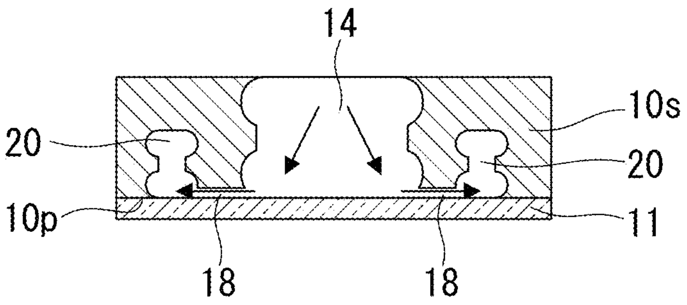
FIG. 22A is a cross-sectional view of a cell main body according to Modification 15.
Figure 22B:
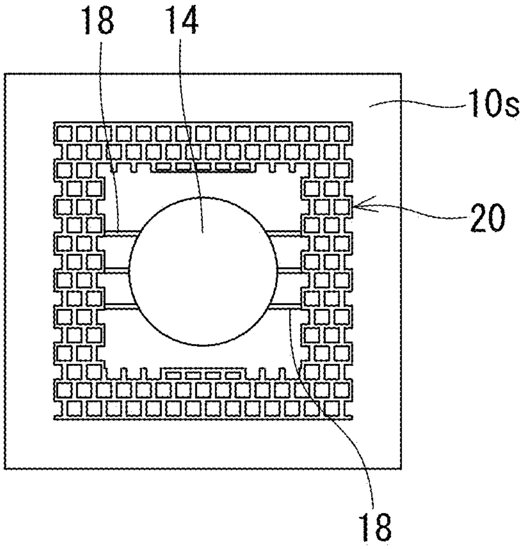
FIG. 22B is a plan view of the cell main body according to Modification 15.

FIG. 22A is a cross-sectional view of a cell main body 10*s* according to Modification 15. FIG. 22B is a plan view of the cell main body 10*s* according to Modification 15. The injection port 16 (FIG. 1) is not provided in the cell main body 10*s*, and the optical chamber 14 also serves as the injection port. That is, it is also possible to introduce the raw material solution 34*a* of the metal gas into the gas generating portion 20 through the optical chamber 14. Owing to the omission of the injection port, the cell main body 10*s* has a simple structure. The arrow in FIG. 22A represents the flow of the raw material solution 34*a*.

Figure 23:
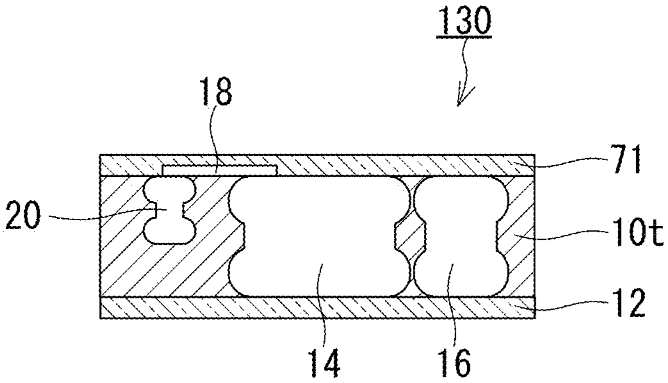
FIG. 23 is a cross-sectional view of a metal-gas-filled cell according to Modification 16.

FIG. 23 is a cross-sectional view of a metal-gas-filled cell 130 according to Modification 16. The metal-gas-filled cell

130 includes a cell main body 10*t*, a first glass sheet 71, and the second glass sheet 12. In the present modification, the microchannel 18 is omitted from the cell main body 10*t*, and the microchannel 18 is provided in the first glass sheet 71 instead. Alternatively, the microchannel 18 may be provided in both the cell main body 10*t* and the first glass sheet 71.

Figure 24:
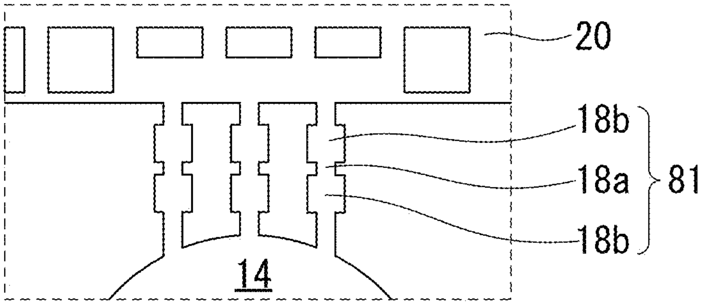
FIG. 24 is a plan view of a microchannel having another structure.

FIG. 24 is a plan view of a microchannel 81 having another structure. In the example shown in FIG. 24, the width of the microchannel 81 is not constant. The microchannel 81 has a first portion 18*a* and a second portion 18*b*. The first portion 18*a* has a width smaller than the second portion 18*b* has. Such a structure makes it easy to prevent the raw material solution 34*a* of the metal gas from entering the optical chamber 14. The microchannel 81 may have the plurality of first portions 18*a* and the plurality of second portions 18*b*.

The microchannel has any depth. That is, the microchannel may have a plurality of portions having depths different from each other. For example, in the microchannel 81 shown in FIG. 24, the depth of the first portion 18*a* may be different from the depth of the second portion 18*b*.

Second Embodiment

Figure 25:
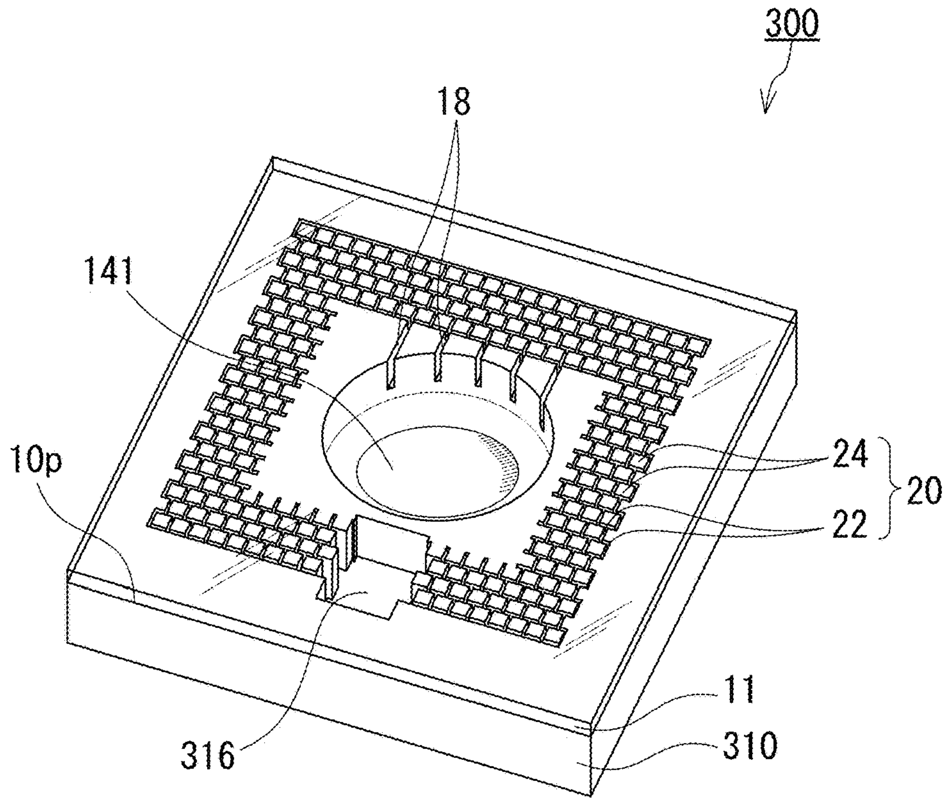
FIG. 25 is a perspective view of a metal-gas-filled cell according to a second embodiment of the present invention.

FIG. 25 is a perspective view of a metal-gas-filled cell 300 according to a second embodiment of the present invention. The metal-gas-filled cell 300 includes a cell main body 310 and a glass sheet 11. The cell main body 310 has a first surface 10*p* and a second surface 10*q*. The glass sheet 11 is attached to the first surface 10*p*. The cell main body 310 has an optical chamber 141, an injection port 316, and a gas generating portion 20. The cell main body 310 has no through hole. The glass sheet 11 is attached to only the first surface 10*p*. The optical chamber 141 and the injection port 316 are each a bottomed hole that is open to only the first surface 10*p*. The structure of the optical chamber 141 is as described with reference to FIG. 17. The injection port 316 communicates with the gas generating portion 20. It is possible to supply the raw material solution 34*a* to the gas generating portion 20 through the injection port 316. In the present embodiment, it can also be said that a portion of the gas generating portion 20 also serves as the injection port 316.

The metal-gas-filled cell 300 can be manufactured, for example, by the following method.

First, the cell main body 310 is produced. The method for producing the cell main body 310 is the same as the method for producing the cell main body 10 described above except that no through hole is provided. Next, the raw material solution 34*a* of the metal gas is injected into the injection port 316 to introduce the raw material solution 34*a* into the gas generating portion 20. The raw material solution 34*a* may be directly introduced into the gas generating portion 20 with a device such as a micropipette. Next, the solvent contained in the raw material solution 34*a* is evaporated to deposit the solid raw material 34*b* of the metal gas in the gas generating portion 20. Next, the glass sheet 11 is attached to the first surface 10*p* of the cell main body 310 by anodic bonding. The attachment of the glass sheet 11 is performed in a vacuum or in an inert gas atmosphere. Lastly, the metal gas is generated from the solid raw material 34*b*, and the metal gas is introduced into the optical chamber 141.

Figure 26:
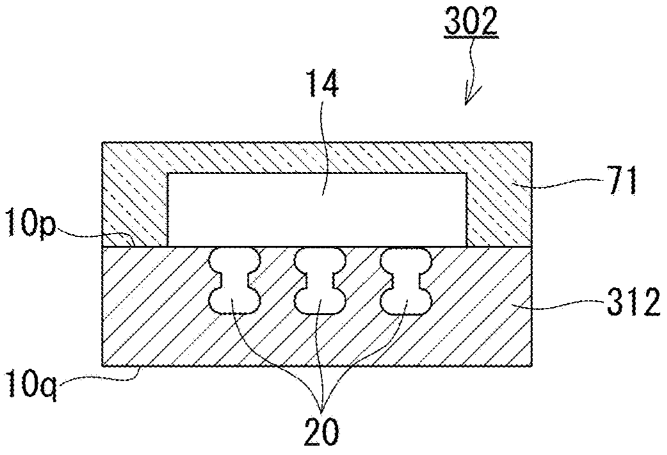
FIG. 26 is a cross-sectional view of a metal-gas-filled cell according to Modification 17.

FIG. 26 is a cross-sectional view of a metal-gas-filled cell 302 according to Modification 17. The metal-gas-filled cell 302 includes a cell main body 312 and the glass sheet 71. The cell main body 312 has the gas generating portion 20. The optical chamber 14 is provided in the glass sheet 71. The optical chamber 14 and the gas generating portion 20 overlay each other in an in-plane direction parallel to the first surface 10*p* which is the bonding surface between the cell main body 312 and the glass sheet 71. In the present modification, the optical chamber 14 and the gas generating portion 20 overlay each other in the first surface 10*p*. Neither microchannel nor injection port is provided in the cell main body 312. According to the present modification, the microchannel and the injection port can be omitted. Further, the second glass sheet can be omitted as well.

(Others)

Other acceptable structures are, for example, as follows.

The optical chamber 14 and the gas generating portion 20 may directly communicate with each other without relaying via the microchannel 18. The microchannel 18 is not required.

The optical chamber 14, the injection port 16, the microchannel 18, and the gas generating portion 20 each may be defined by a through hole. In this case, a portion of the groove 22 defining the gas generating portion 20 is replaced by the through hole.

EXAMPLE

Example

The metal-gas-filled cell described with reference to FIG. 1 and FIG. 2 was manufactured by the method described with reference to FIG. 4A and FIG. 4B.

A thin Cr film serving as the etching mask was formed on a single-crystal silicon wafer serving as the substrate with an electron beam evaporator (EB1200 manufactured by CANON ANELVA CORPORATION). Next, a resist (OFPR-800 54cp manufactured by TOKYO OHKA KOGYO CO., LTD.) was applied onto the thin Cr film by spin coating, and exposure was performed with a high speed maskless laser lithography (D-light DL-1000GS/KCH manufactured by NanoSystem Solutions, Inc.). A resist pattern having opening portions was formed with a developer (SD-1 manufactured by Tokuyama Corporation). Next, the thin Cr film was etched with a Cr etchant (S-CLEAN S-24 manufactured by SASAKI CHEMICAL CO., LTD.) to impart the same pattern as that for the resist to the thin Cr film. Then, the resist was removed. Deep etching was performed on the substrate with a deep reactive ion etcher (RIE-800PB-KU manufactured by Samco Inc.). After the reactive ion etching ended, the substrate was washed to remove the thin Cr film serving as the etching mask. Thus, the cell main body, which has the optical chamber, the gas generating portion, the injection port, and the microchannel, was obtained.

The first glass sheet was attached to the first surface of the cell main body by anodic bonding with a wafer bonder (WAP-100 manufactured by Bondtech Co., Ltd.). The first glass sheet used was borosilicate glass having a thickness of 0.3 mm. The anodic bonding was performed under the conditions of 400° C. and the applied voltage of 1 kV. Next, the posture of the cell main body was kept so that the first glass sheet was positioned on the lower side, and 4.0 μL of the $CsN_3$ aqueous solution was injected into the injection port of the cell main body to permeate the gas generating portion. The concentration of $CsN_3$ (manufactured by Sigma-Aldrich Co., LLC.) in the $CsN_3$ aqueous solution was 2.0 mg/μL. Next, the cell main body was placed on a hot plate set to 80° C. to evaporate water of the $CsN_3$ aqueous solution. Next, the second glass sheet was attached to the second surface of the cell main body in a vacuum of $10^{-5}$ Pa by anodic bonding with the wafer bonder. The second glass sheet used was borosilicate glass having a thickness of 0.3 mm. The anodic bonding was performed under the conditions of 250° C. and the applied voltage of 1 kV. Before the attachment, the second surface of the cell main body and the surface of the second glass sheet were activated by $O_2$ ions and $N_2$ radicals. Lastly, the set of the first glass sheet, the cell main body, and the second glass sheet was heated to 330° C. to 340° C. to progress the decomposition reaction of $CsN_3$. Thus, Cs gas and $N_2$ gas are generated. In this manner, the metal-gas-filled cell of the example was obtained. The metal-gas-filled cell of the example was in the shape of a square in plan view, and had dimensions of 8 mm×8 mm×2.1 mm.

[Absorption Measurement]

Figure 27:
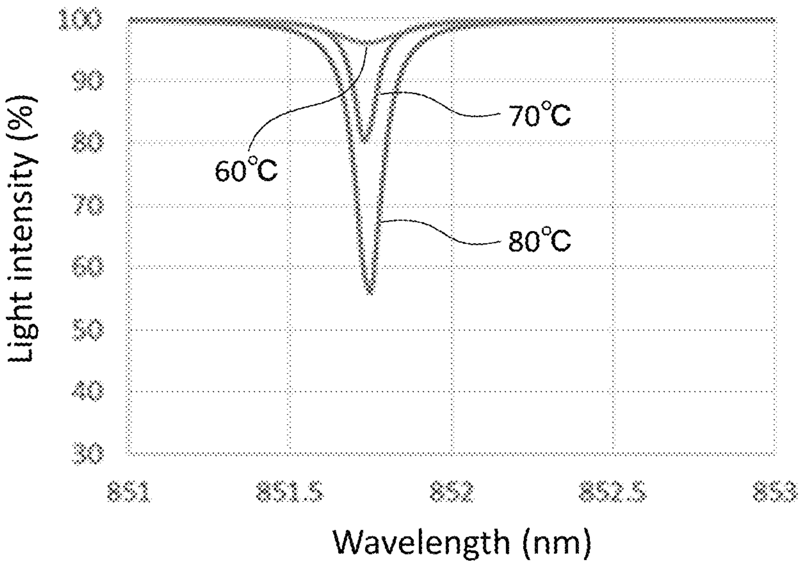
FIG. 27 is a graph obtained by normalizing and fitting graphs of the absorbance at 60° C., 70° C., and 80° C.

With an ultraviolet-visible near-infrared spectrophotometer (V-650 manufactured by JASCO Corporation), the metal-gas-filled cell of the example was irradiated with light having a wavelength near the D2 line (852.1 nm) of Cs to measure the absorbance. The measurement was performed while heating the metal-gas-filled cell from room temperature to 80° C. in stages. The results are shown in FIG. 27. Note that although the CPT resonance occurs at the D1 line (894.6 nm), the measurement was performed for the D2 line. This is because it is only necessary here to observe an increase of the Cs vapor pressure through an observation of the absorption phenomenon.

FIG. 27 is a graph obtained by normalizing and fitting graphs of absorbance at 60° C., 70° C., and 80° C. As shown in FIG. 27, the peak became sharper with increase in temperature, and an increase of the Cs vapor pressure inside the metal-gas-filled cell was observed.

During the generation of Cs, the entire metal-gas-filled cell is heated to about 330° C., which is the thermal decomposition temperature of $CsN_3$, and a sufficient amount of Cs gas is thus generated. Accordingly, the vapor pressure of Cs gas at room temperature to about 80° C., which is the driving temperature of the Cs atomic clock, is the saturated vapor pressure. As the temperature of the metal-gas-filled cell increases from room temperature to 80° C., the saturated vapor pressure increases. This increases the vapor pressure of Cs gas, and accordingly increases the absorbance as well.

[Observation of Cross Section with SEM]

To check the state of solid $CsN_3$ remaining in the gas generating portion of the metal-gas-filled cell of the example, the longitudinal cross section of the metal-gas-filled cell was observed with a scanning electron microscope (SEM).

Figure 28:
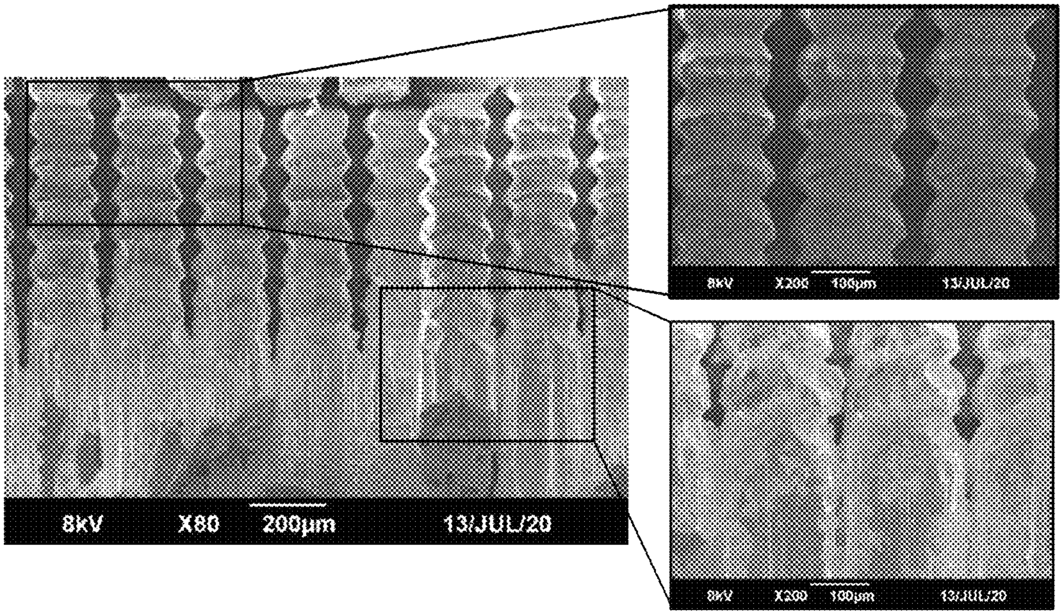
FIG. 28 is a cross-sectional SEM image of a gas generating portion of a metal-gas-filled cell of an example.

FIG. 28 is a cross-sectional SEM image of the gas generating portion of the metal-gas-filled cell of the example. As shown in FIG. 28, the solid raw material ($CsN_3$ in the example) remained in the gas generating portion even after the completion of the metal-gas-filled cell. A large amount of the solid raw material was present on the bottom portion of the groove defining the gas generating portion. At a position close to the opening portion of the groove, the solid raw material was slightly adherent to the surface of the pillar. That is, the solid raw material included portions that are roughly classified into (i) a first remaining portion that is present over the adjacent pillars to fill the bottom portions of the plurality of grooves and (ii) a second remaining portion coating the surface of the pillar.

INDUSTRIAL APPLICABILITY

The metal-gas-filled cell of the present invention is useful for atomic clocks, magnetic sensors, inertial sensors, and the like.

The invention claimed is:

1. A metal-gas-filled cell, comprising:

a cell main body comprising a first surface, an injection port, and a gas generating portion;

a first glass sheet attached to the first surface of the cell main body;

an optical chamber that is provided in the cell main body and is open to the first surface, the optical chamber communicating with the gas generating portion; and a metal gas filling the optical chamber, wherein the gas generating portion comprises a plurality of grooves that are open to the first surface, the injection port is open to the first surface, and communicates with the gas generating portion, a width of each of the plurality of grooves cyclically varies along a thickness direction of the cell main body, and the optical chamber, the injection port, and the gas generating portion are formed on a single substrate defining the cell main body.

2. The metal-gas-filled cell according to claim 1, further comprising:

a solid raw material of the metal gas, the solid raw material being adherent to the gas generating portion.

3. The metal-gas-filled cell according to claim 2, wherein the gas generating portion comprises a plurality of pillars, and the solid raw material comprises a first remaining portion and a second remaining portion, the first remaining portion being present over the adjacent pillars to fill bottom portions of the plurality of grooves, the second remaining portion coating a surface of the pillar.

4. The metal-gas-filled cell according to claim 1, further comprising:

a microchannel allowing the optical chamber and the gas generating portion to communicate with each other.

5. The metal-gas-filled cell according to claim 1, wherein the cell main body further comprises a second surface, the metal-gas-filled cell further comprises a second glass sheet attached to the second surface of the cell main body, and the injection port comprises a through hole extending from the first surface to the second surface.

6. The metal-gas-filled cell according to claim 1, wherein an upper surface of the gas generating portion is bonded to the first glass sheet.

7. The metal-gas-filled cell according to claim 1, wherein the gas generating portion comprises a plurality of pillars, and upper surfaces of the plurality of pillars are bonded to the first glass sheet.

8. The metal-gas-filled cell according to claim 1, wherein the injection port has a smaller opening area than the optical chamber has.

9. The metal-gas-filled cell according to claim 1, wherein the gas generating portion surrounds the optical chamber in plan view.

10. The metal-gas-filled cell according to claim 1, wherein the gas generating portion defines at least a portion of a path from the injection port to the optical chamber.

11. The metal-gas-filled cell according to claim 1, wherein the metal-gas-filled cell is in the shape of a square in plan view.

12. A method for manufacturing the metal-gas-filled cell according to claim 1, comprising:

attaching the first glass sheet to the first surface of the cell main body to cover the gas generating portion and the injection port;

injecting a raw material solution of a metal gas into the injection port to introduce the raw material solution into the gas generating portion; and evaporating a solvent contained in the raw material solution to deposit a solid raw material of the metal gas in the gas generating portion.

13. The method according to claim 12, wherein the gas generating portion comprises a plurality of pillars.

14. The method according to claim 12, wherein in preparing the cell main body, the gas generating portion and the injection port are collectively fabricated by deep reactive ion etching.

15. The method according to claim 12, wherein the cell main body is made of silicon.

16. The method according to claim 12, wherein the raw material solution is a solution comprising a metal compound.

17. The method according to claim 12 further comprising generating the metal gas from the solid raw material, and introducing the metal gas into an optical chamber communicating with the gas generating portion.

18. The method according to claim 17, wherein the metal gas is generated from the solid raw material by heating the cell main body to 250° C. or higher and 400° C. or lower.

19. The method according to claim 12, wherein the cell main body further comprises a second surface, the metal-gas-filled cell further comprises a second glass sheet attached to the second surface of the cell main body, the injection port comprises a through hole extending from the first surface to the second surface, and the raw material solution of the metal gas is injected into the injection port with the first glass sheet being positioned below the gas generating portion in a vertical direction.

20. The method according to claim 19, further comprising attaching a second glass sheet to the second surface of the cell main body, wherein the attaching the second glass sheet to the second surface of the cell main body is performed at a temperature lower than a heating temperature for the cell main body for generating the metal gas from the solid raw material.

* * * * *